US012796491B2

(12) United States Patent
Davis et al.

(10) Patent No.: US 12,796,491 B2
(45) Date of Patent: Nov. 10, 2026

(54) MOLDED LAYERED BRIDGE AND METHOD OF MAKING THE SAME

(71) Applicant: Deca Technologies USA, Inc., Tempe, AZ (US)

(72) Inventors: Robin Davis, Vancouver, WA (US); Timothy L. Olson, Phoenix, AZ (US); Craig Bishop, Scottsdale, AZ (US); Clifford Sandstrom, Richfield, MN (US); Paul R. Hoffman, San Diego, CA (US)

(73) Assignee: Deca Technologies USA, Inc., Tempe, AZ (US)

( * ) Notice: Subject to any disclaimer, the term of this patent is extended or adjusted under 35 U.S.C. 154(b) by 0 days.

(21) Appl. No.: 19/330,040

(22) Filed: Sep. 16, 2025

(65) Prior Publication Data

US 2026/0101777 A1 Apr. 9, 2026

Related U.S. Application Data

(60) Provisional application No. 63/703,577, filed on Oct. 4, 2024.

(51) Int. Cl.

| | |
|---|---|
| ***H10W 70/60*** | (2026.01) |
| ***H10W 70/05*** | (2026.01) |
| ***H10W 70/65*** | (2026.01) |
| ***H10W 70/685*** | (2026.01) |
| ***H10W 72/50*** | (2026.01) |

(52) U.S. Cl.
CPC .......... *H10W 70/611* (2026.01); *H10W 70/05* (2026.01); *H10W 70/65* (2026.01); *H10W 70/685* (2026.01); *H10W 72/50* (2026.01)

(58) Field of Classification Search
CPC . H01L 23/5383; H10W 70/611; H10W 70/65; H10W 70/685; H10W 70/05; H10W 72/50
See application file for complete search history.

(56) References Cited

U.S. PATENT DOCUMENTS

| | | | |
|---|---|---|---|
| 2015/0340353 | A1 | 11/2015 | Starkston |
| 2018/0102311 | A1 | 4/2018 | Shih |
| 2020/0411443 | A1 | 12/2020 | Guo |

(Continued)

FOREIGN PATENT DOCUMENTS

| | | |
|---|---|---|
| KR | 1020170111677 | 10/2017 |
| KR | 20200014088 | 2/2020 |

(Continued)

*Primary Examiner* — Jeremy C Norris
(74) *Attorney, Agent, or Firm* — Kenneth C. Booth; Booth Udall, PLC

(57) ABSTRACT

Disclosed is an interposer comprising a bridge having a component comprising a base material and one or more bridge redistribution layers (RDLs) disposed over the component, where the bridge RDLs comprise alternating layers of electrically conductive traces and interleaved dielectric layers comprising polyimide, and a bridge encapsulant disposed between the bridge RDLs, including through mold interconnects disposed in a periphery of the bridge, an encapsulant disposed around the through mold interconnects and around the bridge component, and a frontside interposer build-up over the encapsulants, over the through mold interconnects, and over the bridge.

27 Claims, 17 Drawing Sheets

(56) References Cited

U.S. PATENT DOCUMENTS

| | | | | |
|---|---|---|---|---|
| 2021/0050327 | A1 | 2/2021 | Shih | |
| 2021/0335744 | A1 | 10/2021 | Olson | |
| 2021/0343547 | A1 | 11/2021 | Chang | |
| 2021/0375708 | A1* | 12/2021 | Kuo | H01L 24/20 |
| 2021/0375768 | A1 | 12/2021 | Tsou | |
| 2022/0336362 | A1 | 10/2022 | Hsieh | |
| 2023/0036283 | A1 | 2/2023 | Lin | |
| 2023/0069031 | A1 | 3/2023 | Wu | |
| 2024/0030147 | A1 | 1/2024 | Duan | |

FOREIGN PATENT DOCUMENTS

| | | |
|---|---|---|
| TW | 202230699 | 8/2022 |
| TW | 202320263 | 5/2023 |
| TW | 202331991 | 8/2023 |
| TW | 202333328 | 8/2023 |
| TW | 202416462 | 4/2024 |

* cited by examiner

MOLDED LAYERED BRIDGE AND METHOD OF MAKING THE SAME

RELATED APPLICATIONS

This application claims the benefit, including the filing date, of U.S. provisional patent application No. 63/703,577, that was filed on Oct. 4, 2024, entitled "Molded Layered Bridge and Method of Making the Same", the entire disclosure of which is hereby incorporated by this reference.

TECHNICAL FIELD

The disclosure relates to the field of electronic assemblies, semiconductor packages, and interposers comprising bridges, and methods for forming the same. More particularly, the disclosure relates to electronic assemblies comprising interposers which comprise bridges.

BACKGROUND

As semiconductor devices become increasingly complex, heterogeneous integration has become important to meet the demands of high-performance applications. Advanced packaging technologies are beneficial to integrate multiple functional components into a compact form factor, all while achieving the electrical performance, mechanical stability, and also manufacturability required for high volume production. Interposer technology plays an important role in heterogeneous integration by minimizing form factor while maintaining electrical performance. The use of interposers comprising bridges further supports heterogeneous integration by interconnecting high performance devices having differing functionality.

SUMMARY

The foregoing and other aspects, features, and advantages will be apparent from the description and drawings, and from the claims if any are included.

In some aspects, the disclosure concerns an interposer, including a known good build-up RDL bridge including: a component including a structural base material and one or more bridge redistribution layers (RDLs) disposed over the component; and a bridge encapsulant disposed between the bridge RDLs; through mold interconnects disposed in a periphery of the known good build-up RDL bridge; a backside interposer build-up electrically coupled to the through mold interconnects and the component opposite the bridge RDLs; an encapsulant disposed around the through mold interconnects, around the known good build-up RDL bridge and over the backside interposer build-up; and a frontside interposer build-up over the encapsulant, over the through mold interconnects, and electrically coupled to the known good build-up RDL bridge.

In some instances, the disclosure concerns an interposer, where the bridge encapsulant includes a planarized surface.

In additional instances, the disclosure concerns an interposer, where the structural base material of the build-up RDL bridge includes one or more of silicon (Si), silicon nitride (SiN), GaAs, GaN, SiC, InP, SiGe, a semiconductor, polymer, mold compound, and laminate.

In some aspects, the disclosure concerns an interposer, where the bridge RDLs include alternating layers of electrically conductive traces and interleaved dielectric layers including polymer; and conductive interconnects coupled to the component that extend through the encapsulant.

In further aspects, the disclosure concerns an interposer, where the bridge encapsulant is disposed between upper and lower layers of dielectric, where the bridge encapsulant is the same as the encapsulant.

In further instances, the disclosure concerns an interposer, where the fan-out RDL bridge further includes one or more passive devices, capacitors, MIM capacitors, inductors, integrated passive devices (IPDs), Si-based IPDs, deep trench capacitors (DTCs), a chip, an integrated circuit, an active device, a buffer, a retimer, a filter, and a voltage regulator.

In some aspects, the disclosure concerns an interposer, where the frontside interposer build-up includes: alternating layers of electrically conductive traces and interleaved dielectric layers including polymer; and micro-pads (μPads) coupled to the alternating layers of electrically conductive traces to enable attachment of one or more of a chip and chiplet devices, including processors and memory components.

In additional aspects, the disclosure concerns an interposer, where the bridge encapsulant is disposed between an upper layer of dielectric and a lower electrically conductive trace of the bridge RDLs, where the bridge encapsulant is the same as the encapsulant.

In further aspects, the disclosure concerns an interposer, where the encapsulant directly contacts the bridge encapsulant at an edge of the build-up RDL bridge.

In additional instances, the disclosure concerns an interposer, including a bridge including: a component including a base material and one or more bridge redistribution layers (RDLs) disposed over the component, where the bridge RDLs include alternating layers of electrically conductive traces and interleaved dielectric layers including polymer; a bridge encapsulant disposed between or over the one or more bridge RDLs; through mold interconnects disposed in a periphery of the bridge; an encapsulant disposed around the through mold interconnects and around the bridge component, where the encapsulant directly contacts the bridge encapsulant at an edge of the bridge; and a frontside interposer build-up over the encapsulant, over the through mold interconnects, and over the bridge.

In some aspects, the disclosure concerns an interposer, where the bridge RDLs further include conductive interconnects electrically coupled to the electrically conductive traces that extend through the encapsulant.

In further aspects, the disclosure concerns an interposer, where the bridge encapsulant is disposed between an upper layer of dielectric and a lower electrically conductive trace of adjacent bridge RDLs.

In some instances, the disclosure concerns an interposer, where the bridge encapsulant is disposed between an upper layer of dielectric and a lower layer of dielectric of adjacent bridge RDLs.

In further instances, the disclosure concerns an interposer, where the bridge includes a known good bridge.

In some aspects, the disclosure concerns an interposer, further including a backside interposer build-up contacting the component opposite the bridge RDLs and contacting the through mold interconnects.

In additional instances, the disclosure concerns an interposer, where one or more of the bridge encapsulant and the encapsulant includes a planarized surface.

In some instances, the disclosure concerns an interposer, where the bridge further includes one or more passive devices, capacitors, MIM capacitors, inductors, integrated passive devices (IPDs), Si-based IPDs, deep trench capacitors (DTCs), a chip, an integrated circuit, an active device, a buffer, a retimer, a filter, and a voltage regulator.

In some aspects, the disclosure concerns interposers having polymer layers comprising polyimide.

In additional instances, the disclosure concerns a method of forming an interposer, including: forming a plurality of build-up RDL bridges, including forming one or more bridge redistribution layers (RDLs) over a base material, where the bridge RDLs include vertically stacked layers of build-up RDLs disposed over the base material; singulating the base material to provide the plurality of build-up RDL bridges; forming a plurality of through mold interconnects disposed in a periphery of bridge mounting sites disposed on a carrier; mounting at least one build-up RDL bridge on one or more of the bridge mounting sites; disposing encapsulant over and around the plurality of through mold interconnects and the at least one build-up RDL bridge, and forming a frontside interposer build-up over the encapsulant, over the through mold interconnects, and over the at least one build-up RDL bridge.

In some aspects, the disclosure concerns a method, further including forming the one or more bridge RDLs including alternating layers of electrically conductive traces and interleaved dielectric layers including polymer; and forming conductive interconnects electrically coupled to the electrically conductive traces.

In additional aspects, the disclosure concerns a method, where the interleaved dielectric layers further include a bridge encapsulant disposed between upper and lower layers of polymer, where the bridge encapsulant is the same as the encapsulant disposed around the through mold interconnects.

In some instances, the disclosure concerns a method, where the bridge encapsulant includes a planarized surface.

In additional instances, the disclosure concerns a method, where forming the frontside interposer build-up further includes: forming alternating layers of electrically conductive traces and interleaved dielectric layers including polymer; and forming micro-pads (μPads) coupled to the alternating layers of electrically conductive traces to enable attachment of one or more of chips and chiplet devices, including processors and memory components.

In some instances, the disclosure concerns a method, where the method further includes: testing the plurality of build-up RDL bridges to identify known good build-up RDL bridges; mounting at least one known good build-up RDL bridge on one or more of the bridge mounting sites; and disposing encapsulant over and around the plurality of through mold interconnects and the at least one known good build-up RDL bridge, and forming a frontside interposer build-up over the encapsulant, over the through mold interconnects, and over the at least one known good build-up RDL bridge.

In some aspects, the disclosure concerns a method, further including disposing one or more passive devices, capacitors, MIM capacitors, inductors, integrated passive devices (IPDs), Si-based IPDs, deep trench capacitors (DTCs), a chip, an integrated circuit, an active device, a buffer, a retimer, a filter, and a voltage regulator in the build-up RDL bridges.

In further aspects, the disclosure concerns a method, where the interposer is formed using unit specific patterning.

In some instances, the disclosure concerns a method including a polymer, wherein the polymer comprises polyimide.

BRIEF DESCRIPTION OF THE DRAWINGS

Implementations will hereinafter be described in conjunction with the appended and/or included drawings, where like designations denote like elements, and.

DETAILED DESCRIPTION

Figure 1:
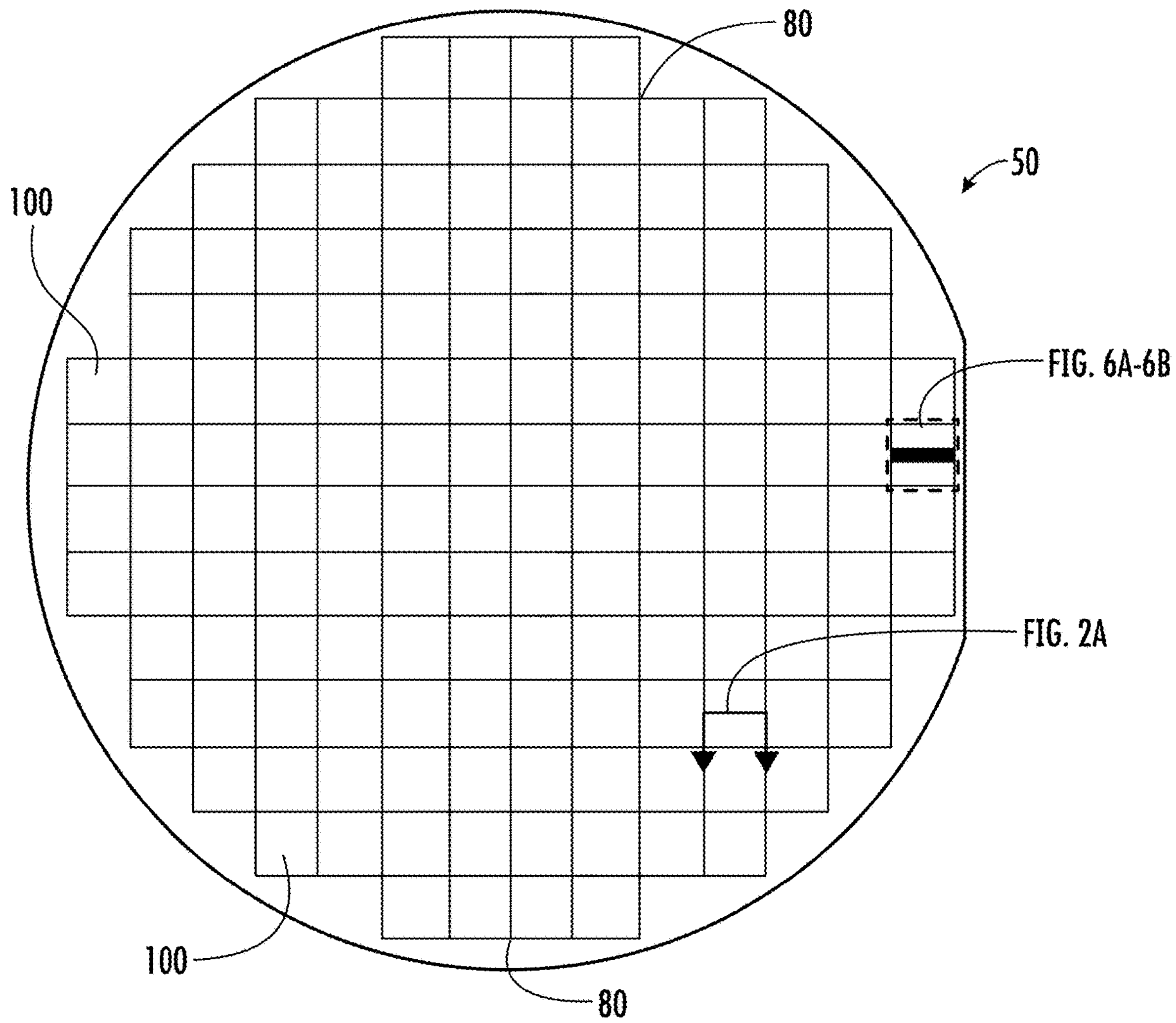
FIG. 1 is an illustration of various embodiments of bridges disposed on a first temporary carrier and after singulation.

The disclosure relates to molded semiconductor structures, devices, packages, and interposers, and more particularly to an interposer comprising molded bridges. This disclosure, its aspects and implementations, are not limited to the specific package types, material types, or other system component examples, or methods disclosed herein. Many additional components, manufacturing and assembly procedures known in the art consistent with semiconductor manufacture and packaging are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

Detailed aspects and applications of the disclosure are described in the drawings and detailed description of the technology. Unless specifically noted, it is intended that the words and phrases in the specification and the claims be given their plain, ordinary, and accustomed meaning to those of ordinary skill in the applicable arts. The inventors are fully aware that they can be their own lexicographer if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for" performing the function of . . . " or "step for performing the function of . . . ," if the claims also recite any structure, material or acts in support of that means or step, or that perform the recited function, then it is the clear intention of the inventors not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

In the following description, and for the purposes of explanation, numerous specific details are set forth in order to provide a thorough understanding of the various aspects of the disclosure. It will be understood, however, by those skilled in the relevant arts, that embodiments of the technology disclosed herein may be practiced without these specific details. It should be noted that there are many different and alternative configurations, devices and technologies to which the disclosed technologies may be applied. The full scope of the technology disclosed herein is not limited to the examples that are described herein.

The singular forms "a," "an," and "the" include plural referents unless the context clearly dictates otherwise. Thus, for example, reference to "a step" includes reference to one or more of such steps.

The word "exemplary," "example," or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

Where the following examples, embodiments and implementations reference examples, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

Throughout the description and claims of this specification, the words "comprise" and "contain" and variations of the words, for example "comprising" and "comprises", mean "including but not limited to", and are not intended to (and do not) exclude other components.

As required, detailed embodiments of the present disclosure are included herein. It is to be understood that the disclosed embodiments are merely exemplary of the invention that may be embodied in various forms. Therefore, specific structural and functional details disclosed herein are not to be interpreted as limits, but merely as a basis for teaching one skilled in the art to employ the present invention. The specific examples below will enable the disclosure to be better understood. However, they are given merely by way of guidance and do not imply any limitation.

The present disclosure may be understood more readily by reference to the following detailed description taken in connection with the accompanying figures and examples, which form a part of this disclosure. It is to be understood that this disclosure is not limited to the specific materials, devices, methods, applications, conditions, or parameters described and/or shown herein, and that the terminology used herein is for the purpose of describing particular embodiments by way of example only and is not intended to be limiting of the claimed inventions. The term "plurality", as used herein, means more than one.

As semiconductor devices become increasingly complex, heterogeneous integration has become important to meet the demands of high-performance applications. Advanced packaging technologies are beneficial to integrate multiple functional components into a compact form factor, all while achieving the electrical performance, mechanical stability, and manufacturability required for high volume production.

The present disclosure relates to use of molded, layered bridges as part of an interposer to address these challenges by using molded fan-out redistribution layer (RDL) technology with embodiments of bridges as disclosed herein. These bridges 100, also referred to as layered bridges, embedded bridges, bridge components, RDL bridges, fan-out bridges, fan-out RDL bridges, molded bridges, fan-out molded RDL bridges, known good bridges 102 (in the instance where the bridge comprises a known good component) and similar structures, serve as high-bandwidth, low-latency interconnects between one or more active chiplets, devices, and chips. As used herein, the term "bridge 100" is taken to also include known good bridges 102 having components which have been tested or inspected prior to assembly such that they are known to be fully functional. The bridges 100 may also be integrated as part of an interposer 200, such as a molded interposer, a molded bridge interposer, a fan-out interposer, a molded fan-out interposer, a fan-out RDL interposer, a fan-out RDL bridge interposer, and similar structures, which for convenience, is referred to herein as interposer 200. The interposer 200 may be known under the proprietary tradename or trademark "M-Series Fan-out Interposer Technology" or ("M FIT"). Additional detail regarding the process flow, including the opportunity to make the interposer in a carrier-less full thickness process is disclosed herein.

The method of making, and the interposer 200 is designed to support the integration of multiple semiconductor components into a single package, which is beneficial for heterogeneous systems that include diverse functionality in a small form factor. The process leverages redistribution layer (RDL) technology for both the interposer 200 and the embedded bridge 100, allowing for high-yield, high-density interconnects with superior electrical performance.

FIG. 1 illustrates a top or plan view of a plurality of molded bridges 100 (either individually or in groups) being formed and separated by saw streets 80. FIGS. 2A-2F, included and discussed further following, illustrate cross-sectional side views of fan-out RDL bridges 100 being formed, as taken along detail line labeled FIG. 2A. FIGS. 6A-6D illustrate plan views of multiple bridges 100 being singulated in groups, which may further include conductive vias 136 disposed between bridges 100. Saw streets 80 are disposed in the starting material, base material, or wafer that forms the bridges 100 and separate the molded bridges 100. In some instances, as shown in FIG. 1, the bridges 100 may be formed or processed over or on a first temporary carrier 50. In other instances, the bridges may be processed without a temporary carrier as part of a carrier-free process.

In some embodiments, the bridges 100 may be formed on, with, or using a base material 24*a*. The base material 24*a* may comprise silicon (Si), silicon nitride (SiN), GaAs, GaN, SiC, InP, SiGe, polymer, mold compound, laminate, glass, and other suitable substrate materials, depending upon the application parameters. According to some embodiments, the component 24 may comprise electrical functionality, and may have semiconducting and other devices disposed therein.

Figure 2A:
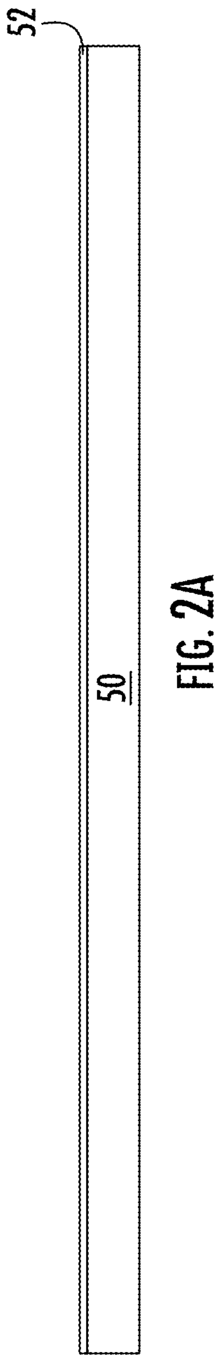
FIG. 2A is a cross section view taken along the detail line 2A shown in FIG. 1 of the first temporary carrier showing an adhesive layer disposed thereon.

FIG. 2A illustrates a first temporary carrier 50, the view as taken along the detail line 2A shown in FIG. 1.

The first temporary carrier 50, when present, may comprise carrier materials such as metal, silicon, polymer, polymer composite, ceramic, perforated ceramic, glass, glass epoxy, stainless steel, mold compound, mold compound with filler, and other suitable low-cost, rigid materials or bulk semiconductor material for structural support. An adhesion layer 52, such as a release tape, a film, a release layer, and similar materials, may be disposed over the temporary carrier 50. Adhesion layer 52 may comprise any of thermal epoxy, epoxy resin, B-stage epoxy laminating film, ultraviolet (UV) B-stage film adhesive layer, UV B-stage film adhesive layer including acrylic polymer, thermo-setting adhesive film layer, a suitable wafer backside coating, backgrind tape, acrylate-based adhesive, epoxy-acrylate adhesive, and a PI-based adhesive. When a UV release tape is used with first temporary carrier 50, the carrier 50 may comprise one or more materials, such as glass, that are transparent or translucent to UV light. When a thermal release is used with the first temporary carrier 50, the carrier 50 may comprise opaque materials. The adhesion layer 52 may be a film or laminate and may also be applied by spin coating or other suitable process.

Figure 2B:
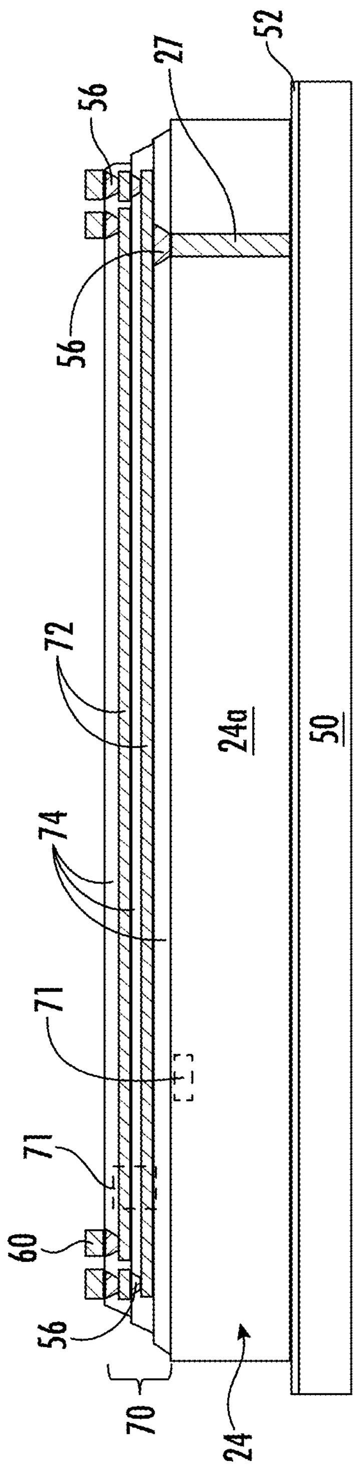
FIG. 2B shows a bridge RDL disposed over a component.

FIG. 2B, continuing from FIG. 2A, illustrates forming a lower bridge redistribution layer (RDL) 70, such as an interconnect redistribution structure, a bridge interconnect structure, a build-up interconnect, a fan-out RDL, and similar structures, disposed over the component 24, comprising base material 24*a*, and over the first temporary carrier 50, if present. In some embodiments, the base material 24*a* may comprise a structural material having only RDL disposed thereon, such as bulk silicon (Si), silicon nitride (SiN), mold compound, laminate, and other suitable substrate materials.

The lower bridge RDL 70 (as well as subsequent bridge RDLs) may comprise a plurality of alternating or interleaved conductive layers 72, and dielectric layers 74. The conductive layers 72 can be formed as traces, wires, differential pairs, redistribution layers (RDLs), fan-out RDLs, vias, vertical interconnects, capture pads, power and (or) ground planes, electrical components, high-density interconnects, high density routing, and other, similar elements. The conductive layers 72 can comprise one or more layers of Al, Cu, Sn, Ni, Au, Ag, or other suitable electrically conductive material, and may be electrically connected to one another using conductive layer to conductive layer bridge vias 56 as necessary in the design of the molded bridge 100. Bridge vias 56 may be formed over the adhesion layer 52 and first temporary carrier 50, as well as formed within holes created in bridge dielectric 74. The vertical interconnects 56 can be formed as vias, conductive columns, pillars, posts, bumps, or studs that are formed of copper or other suitable conductive material. Other portions of conductive layers 72 can be electrically common or electrically isolated depending on the design and function of the molded bridge 100. In some embodiments there may be a vertical interconnect (VI) 27, formed through the base material 24*a* of component 24, such as in particular embodiments, a through silicon via (TSV), in the instance where component 24 comprises silicon, or a through mold interconnect 120 (as further shown and described at FIG. 4A) in the instance where component 24 comprises an encapsulant or mold material. While the VIs 27 are referred to as vertical interconnects for convenience and brevity, VIs 27 are not limited to vias formed through silicon and may further comprise VIs extending through base material 24*a* and disposed within bridge 100. The VIs 27 may extend through base materials 24*a* other than silicon, such as the aforementioned base materials 24*a* or other materials such as ceramic, plastic, silicon dioxide, glass, organic dielectric, epoxy mold compound, inorganic dielectric or any other suitable material. The VIs 27 may be electrically coupled to bridge vias 56 disposed in dielectric 74. Further depicted in FIG. 2B is one or more bridge components 71. Bridge components 71 may comprise one or more passive devices, capacitors, MIM capacitors, integrated passive devices (IPDs), Si-based IPDs, deep trench capacitors (DTCs), a chip, an integrated circuit, an active device, a buffer, a retimer, a filter, and a voltage regulator. According to some embodiments, bridge components 71 may be disposed within, or designed as part of, bridge RDLs 70. According to further embodiments, bridge components 71 may further be formed within base material 24*a* of component 24. The dielectric layers 74 may be interleaved and formed between conductive layers 72 for electrical isolation. The dielectric layers 74 may comprise one or more layers, such as an insulating layer, polyimide (PI), SiO2, Si3N4, SiON, Ta2O5, Al2O3, benzocyclobutene (BCB), polybenzoxazoles (PBO), Ajinomoto Buildup Film (ABF), and other, similar materials having similar insulating and structural properties. The dielectric layers 74 may include filler particles used to adjust the properties of the dielectric material—such as CTE, E (modulus of elasticity), or other property. In some cases, the dielectric layers 74 may include polymers such as Teflon (PTFE), or fillers such as some ceramics that advantageously produce dielectric layers with superior electrical properties such as very low dielectric constant or dissipation factor—which is beneficial for high speed or RF circuits. In an embodiment, the dielectric layer 74 is a photo resist layer or a photo-definable or photosensitive polymer. In particular embodiments, the dielectric layers 74 may be formed comprising polyimide (PI). The dielectric layer 74 may be formed using PVD, CVD, printing, spin coating, spray coating, sintering, thermal oxidation, sol-gel, lamination, or other suitable processes. The dielectric layer 74 may be patterned and a portion of the dielectric layer 74 may be removed by etching, laser drilling, mechanical drilling, developing, or other suitable process to form openings completely through the dielectric layer and to expose at least a portion of the conductive layers 72 for subsequent mechanical and electrical interconnection. Removal of a portion of dielectric layer 74 to form a hole or aperture allows for formation of bridge vias 56 therein for interconnection between conductive layers 72 of the bridge RDL 100. The dielectric layers do not all have to be formed of the same material two or more different dielectric materials may be used in the interconnect stackup.

For applications comprising photo-sensitive polyimide (PI) the following processes may be used: Coat, Expose, Develop, and Cure. Polyimide may be coated to serve as a dielectric, providing excellent electrical insulation and mechanical flexibility. For applications comprising Cu RDL, the following processes may be used: Seed layer deposition, Photoresist Coat, Photoresist Expose, Photoresist Develop, Cu Plating, Photoresist Strip, and Etch of exposed Seed layer. Copper redistribution layers (RDL) are built on the dielectric layers, ensuring high-density interconnects.

The bridge 100 may comprise a component 24 which, in some embodiments, may have only interconnect wiring disposed over a component surface where base material 24*a* comprises a structural material. In further embodiments, component 24 may comprise one or more of a bridge component, a chip, a semiconductor chip, an integrated circuit, an active device, a passive device, a deep trench capacitor (DTC), an integrated passive device (IPD), a buffer, a retimer, a filter, and a voltage regulator. In some embodiments, the component 24 may comprise combinations of interconnect wiring and electrical functionality. FIG. 2B also illustrates conductive interconnects 60, such as conductive studs, conductive bumps, conductive pillars, conductive posts, electrical interconnects and other, similar structures that can be formed as columns, pillars, posts, thick RDLs, bumps, and studs that are formed of copper or other similar conductive material, which are disposed over, and electrically coupled or connected to, components 24 through bridge RDL 70. Further details are disclosed in U.S. Pat. No. 11,538,759, entitled "Fully Molded Bridge Interposer and Method of Making The Same" which issued on Dec. 27, 2022, the disclosure of which is incorporated herein in its entirety. The bridges 100 are formed with the conductive interconnects 60 disposed face up over bridge 100 and the first temporary carrier 50, before disposing a bridge encapsulant 76 over the first temporary carrier 50 (when used), over the component 24, and over the lower bridge RDL 70. Conductive interconnects 60 may be formed from similar materials and methods as disclosed for bridge vias 56.

The process of bridge RDL 70 buildup and conductive interconnect 60 formation enables the bridge 100 to function as a high-bandwidth, low-latency, low-power link between different dies, chiplets, components, and devices having different functionalities, in the final assembly 300. The bridge 100 could also include passive devices—e.g., capacitors, resistors, inductors, and similar passive components, constructed using the conductive layers 72 and dielectric layers 74, such as polyimide (PI). In some embodiments, bridge RDLs 70 comprise bridge vias 56 which are vertically stacked over one another and electrically coupled to conductive layers 72, and separated by dielectric layers 74, such as polyimide (PI). In some embodiments, a higher dielectric constant material, such as used as the insulator in a metal-insulator-metal capacitor (MIM caps) may be desirable. Passive devices may be formed as part of bridge 100 using interdigitated traces, for example forming capacitors that, in embodiments where base material 24*a* comprises a mold compound or encapsulant, are embedded in the mold compound of the bridge 100. In particular embodiments where the base material 24*a* of bridge 100 comprises Si, base material 24*a* could be replaced by a Si-based integrated passive device (IPD). Having capacitors or deep trench capacitors disposed in the bridge 100 could be beneficial to reduce ground bounce where the voltage surge on the internal ground (die ground) of a chip is higher than the external printed circuit board ground when multiple transistors switch simultaneously. In other embodiments, for example when forming inductors, a magnetic material can be included as a core material or an enclosing material to improve the performance of the inductor.

The bridge RDL 70 may be formed using unit specific patterning (such as patterning (custom lithography) and build-up interconnect structures such as the bridge RDL 70, which is also known under the trademark "Adaptive Patterning") with respect to the bridge may provide a number of advantages. Unit specific patterning: (i) allows high-speed bridge attach for bridges and unit specific patterning will ensure alignment for high density interconnects between an interposer and attached devices, (ii) aligns via to conductive interconnects, allowing largest contact vias with smallest interconnects (fine pitch), (iii) with respect to an interposer, makes the molded bridge interposer, including a frontside build-up interconnect structure, much cheaper that a large interposer die, (iv) with respect to EMIB, vias can be large compared to conductive interconnect and capture pad size, lithography defined vias (not laser drilled), (v) allows connections between devices inside the molded bridge interposer with unit specific patterning or routing to compensate for component shift (including bridge shift) between embedded devices, which may include memory controllers, voltage regulators, SERDES, etc., and (vi) make embedding active devices more useful.

Figure 2C:
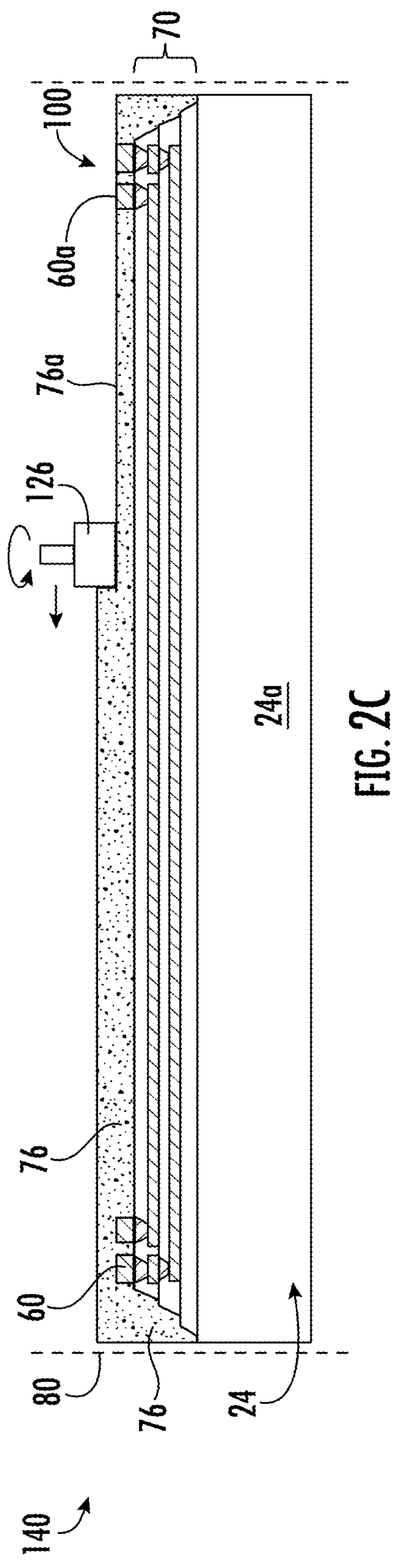
FIG. 2C illustrates planarization of a bridge encapsulant disposed over a bridge RDL and a component, and saw streets.

FIG. 2C illustrates applying a bridge encapsulant 76 over the lower fan out bridge RDL 70 and over component 24 to form a molded base 140 which is subsequently singulated along saw streets 80 to form multiple bridges 100. Where more than one bridge RDL 70 is applied, singulation may occur in a subsequent process than as shown, such as at FIG. 2D. The bridge encapsulant 76 may comprise an organic material, a mold compound, a polyimide, a composite material, such as epoxy resin with filler, ABF or epoxy acrylate with filler, and is a material suitable for planarizing, such as through chemical mechanical planarizing (CMP), diamond cutter planarizing, or grinding. When the bridge 100 is formed comprising many redistribution layers the bridge encapsulant 76 may be advantageously utilized to provide a structure to planarize (every few layers) to prevent warpage, non-planarity, and non-flatness of the bridge RDL layers 70 (similar to MDx, as referenced herein). FIG. 2C also shows the bridge encapsulant 76 of molded base 140 can undergo a grinding operation with a grinder 126 to planarize the surface of the bridge encapsulant 76 to form planarized surface 76*a* of the bridge encapsulant and reduce a thickness of the molded base 140 and bridges 100. The planarizing or grinding of the encapsulant 124, (depicted at FIG. 4B and others) produces a planarized encapsulant surface 124*a*, and exposes a planarized top 60*a* (also shown in FIG. 2E) of conductive interconnects 60, having a flatness of within a range of about 0.5-2.0 micrometers (μm) and a total roughness height from peak to valley of between 5 nanometers (nm) and 2 μm measured over a characteristic measurement distance. The characteristic measurement distance may comprise a distance or length of about 1 millimeter (mm). Planarization can be used to remove material from the surface of the molded base 140, and produce a uniformly flat surface. Alternatively, mechanical abrasion without the use of corrosive chemicals is used for planarization. While conventional encapsulant grinding might be done with less flatness, greater accuracy and precision can be obtained by using integrated sensors such as laser, acoustic, or other non-contact methods to control the grinding, resulting in better flatness.

Figure 2D:
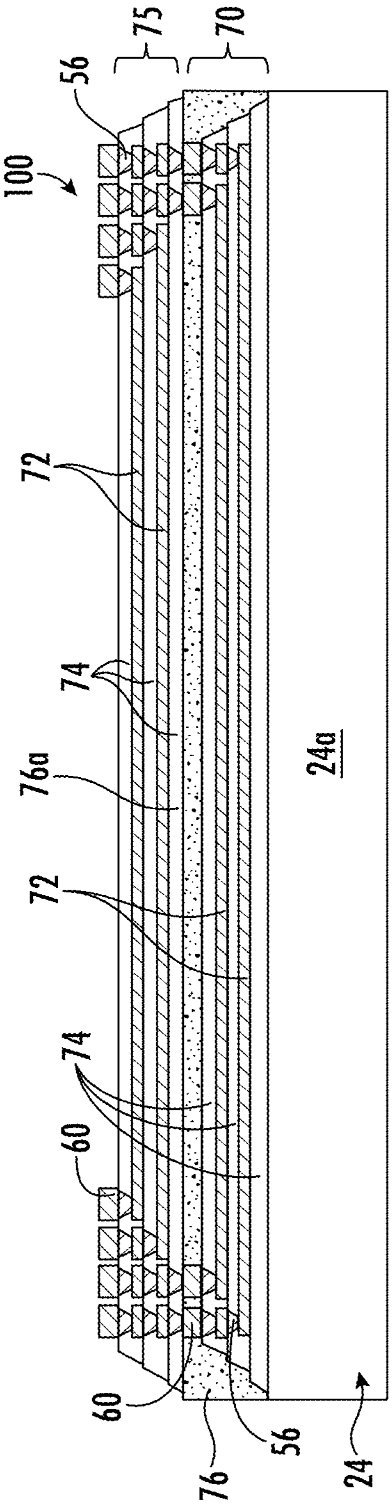
FIG. 2D depicts an upper bridge RDL disposed over a bridge encapsulant and over a lower bridge RDL and component.

FIG. 2D, continuing from FIG. 2C, illustrates an upper bridge RDL 75 being formed in a similar manner as the lower bridge RDL 70, over the bridge encapsulant 76, over and coupled to the lower bridge RDL 70 through conductive interconnects 60. In some embodiments, upper bridge RDL 75 may be formed over the planarized surface 76*a* of a lower layer of the bridge encapsulant 76, and conductive interconnects 60 of the lower bridge RDL 70 electrically coupled to bridge vias 56 of upper bridge RDL 75. While depicted similarly, a person of ordinary skill in the art (a "POSA") would understand that upper bridge RDL 75 and lower bridge RDL 70 may comprise differing numbers of dielectric and conductive layers, as well as conductive elements formed from differing materials, as well as formed from different designs dependent upon product requirements. FIG. 2D also illustrates a bottom dielectric layer 74 formed as part of the lower bridge RDL 70, with the dielectric layer 74 disposed between the base material 24*a* of component 24 and a first conductive layer 72. While depicted herein with upper and lower bridge RDLs 70, 75, respectively, a POSA would understand that a single, or additional, bridge RDLs may be disposed over component 24.

Figure 2E:
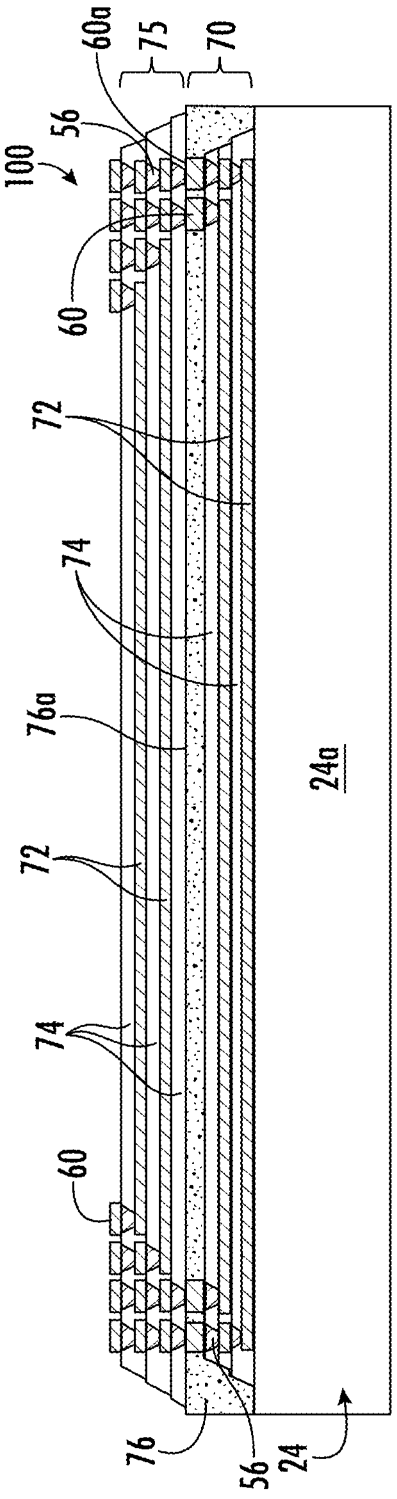
FIG. 2E represents the bridge RDL of FIG. 2D where the component contacts a first conductive layer of the lower bridge RDL.

FIG. 2E illustrates an RDL bridge 100 similar to the RDL bridge 100 illustrated in FIG. 2D. FIG. 2E differs from FIG. 2D in that FIG. 2E illustrates the component 24 contacting a first conductive layer 72 of the lower bridge RDL 70. As in FIG. 2D, the embodiment of FIG. 2E also illustrates where the bridge encapsulant 76 is disposed between an upper layer of polyimide and a lower layer of polyimide, of adjacent upper and lower bridge RDLs 70, 75, respectively, such that the bridge RDLs are separated by the bridge encapsulant 76.

Figure 2F:
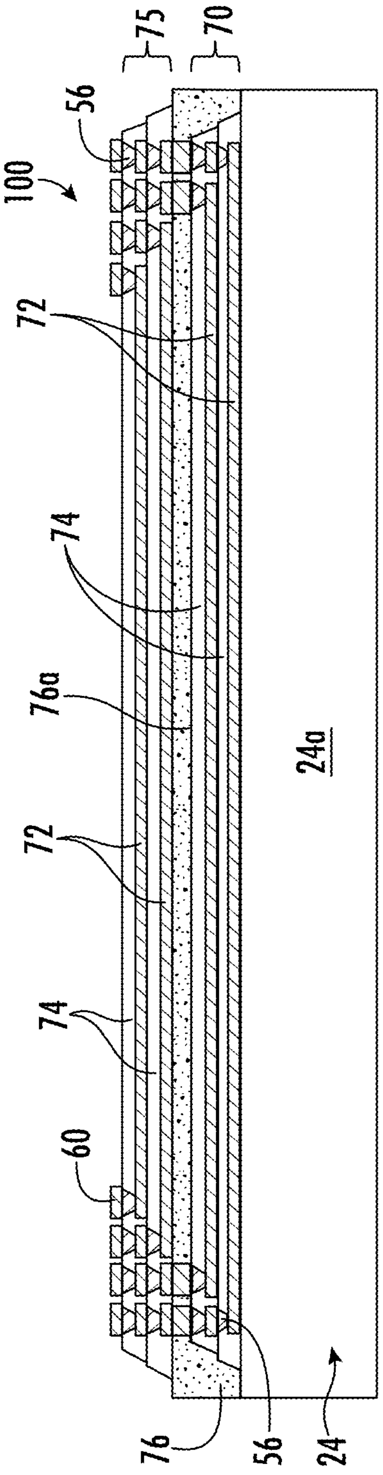
FIG. 2F shows the bridge RDL of FIG. 2E where a first conductive layer of the upper bridge RDL contacts the bridge encapsulant.

FIG. 2F illustrates an RDL bridge 100 similar to the bridge 100 illustrated in FIG. 2E. FIG. 2F differs from FIG. 2E in that FIG. 2F illustrates an instance where the upper bridge RDL 75 disposed over the bridge encapsulant 76 comprises a conductive layer 72 directly contacting the bridge encapsulant 76 (i.e., does not comprise an intervening layer of dielectric or PI). The embodiment of FIG. 2F further illustrates, similar to FIG. 2E, where the component 24 directly contacts a first conductive layer 72 of the lower bridge RDL 70. According to the embodiment of FIG. 2F, the bridge encapsulant 76 is disposed between two adjacent bridge RDLs, upper and lower bridge RDLs 70, 75, respectively, contacting an upper layer of polyimide of lower bridge RDL 70 and a lower, electrically conductive trace of upper bridge RDL 75, where the adjacent bridge RDLs 70 are separated by the bridge encapsulant 76. While FIGS. 2A-2F depict a bridge 100 comprising a single layer of bridge encapsulant 76, a POSA would understand that additional layers of bridge encapsulants 76 could be formed, including in some embodiments a topmost bridge encapsulant 76 as a final encapsulant layer disposed over upper bridge RDL 75 and conductive interconnects 60.

The bridges 100 from any of the preceding FIGs. may be singulated individually or in groups, as called for by the design implementation, and removed from one or more of the first temporary carrier 50, and from each other, by removing material in the saw street 80. The bridges 100 may then be incorporated into an interposer 200, as described in further detail below. While depicted using first temporary carrier 50, a POSA would understand that the method as disclosed herein may be performed without first temporary carrier 50, in a carrierless process as disclosed herein.

Bridges 100 may be tested (electrically or optically) and potentially repair, replace, or rework traces and other electrical elements before the bridges 100 are embedded in the interposer 200 to identify and use only known-good bridges and to ensure the whole interposer 200 is functional at the end of the process. In embodiments comprising known good bridges 102, the interposer may comprise a known good interposer 202. Traces as part of conductive layer 72 of the bridge RDLs 70 would be corrected as the bridges are being fabricated-layer by layer. Testing or optical inspection could be layer by layer with defects fixed when they are found. After the whole bridge is fabricated—then a final electrical test can be done to ensure the bridges are electrically good (no opens or shorts, could also test for desired electrical properties like impedance, inductance, or other desired feature). In this way only known-good bridges 102 would be placed on a second temporary carrier 110 during interposer build-up, as shown in FIG. 4A and subsequent FIGs.

Figure 3:
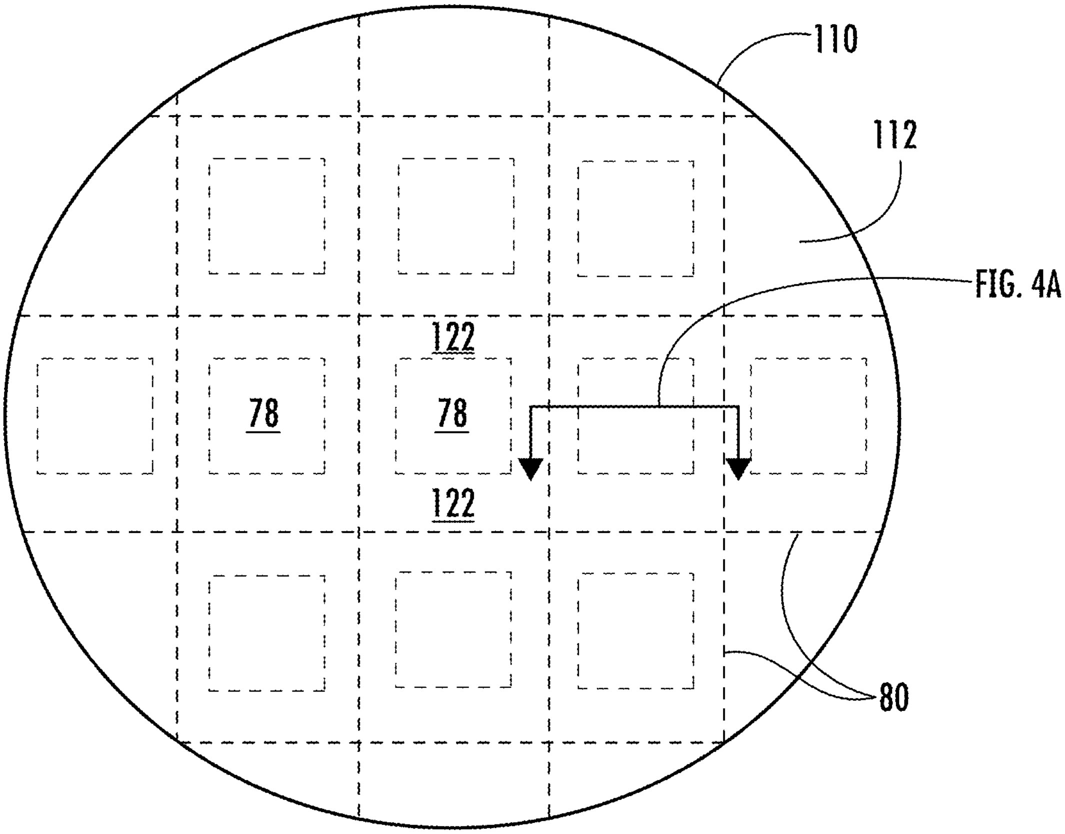
FIG. 3 illustrates a top or plan view of a plurality of bridge mounting sites each having a periphery around the mounting sites, disposed over a second temporary carrier and separated by saw streets.

FIG. 3 illustrates a top or plan view of a plurality of molded bridge mounting sites 78, each having a periphery 122 around the mounting sites 78, being formed or disposed over a second temporary carrier 110 and separated by saw streets 80. FIGS. 4A-4D, included and discussed further below, illustrate cross-sectional side views of various embodiments of interposers 200 being formed, as taken along detail lines labeled FIG. 4A.

Figure 4A:
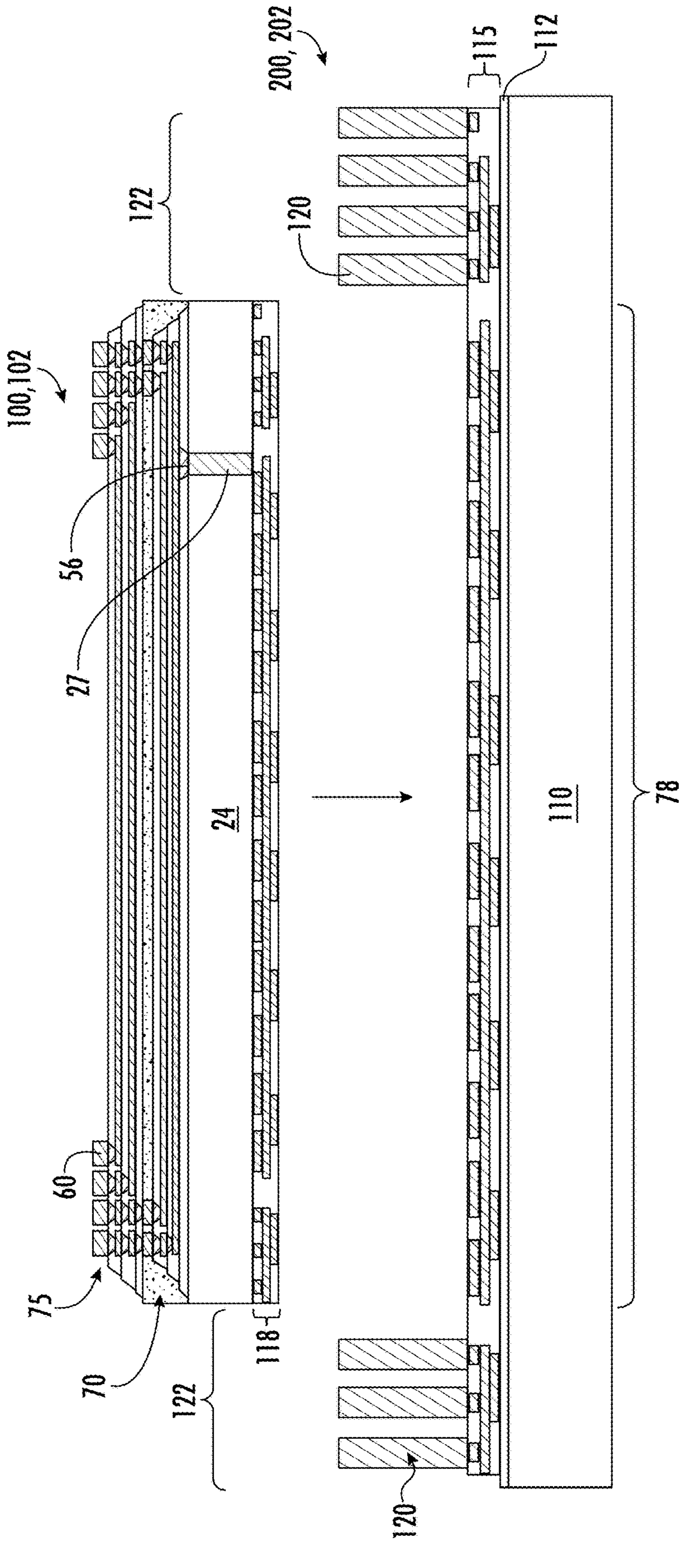
FIGS. 4A-4D illustrate cross-sectional side views of various embodiments of interposers being formed.

FIG. 4A illustrates a cross-sectional side view of assembly of an interposer 200, 202 (where interposer 202 comprises a known good component), the method using a second temporary carrier 110. Depicted in FIG. 4A is mounting the bridge 100, 102 over mounting site 78 of temporary carrier 110 as part of the method of forming interposer 200, 202. The second temporary carrier 110 may comprise base materials such as metal, silicon, polymer, polymer composite, ceramic, perforated ceramic, glass, glass epoxy, stainless steel, mold compound, mold compound with filler, and other suitable low-cost, rigid material or bulk semiconductor material for structural support. FIG. 4A shows the second temporary carrier 110 comprising a molded bridge mounting site 78 to which the molded bridge 100, 102 may be coupled. A release tape 112 may be disposed over the temporary carrier. The release tape 112 may comprise any of a thermal epoxy, epoxy resin, B-stage epoxy laminating film, ultraviolet (UV) B-stage film adhesive layer, UV B-stage film adhesive layer including acrylic polymer, thermo-setting adhesive film layer, a suitable wafer backside coating, backgrind tape, epoxy-acrylate adhesive, and a PI-based adhesive. The release tape 112 may be a film or laminate and may also be applied by spin coating or other suitable process. Further shown in FIG. 4A is a lower base build-up interconnect structure 115, which according to the design, may or may not be present. When present, the lower base build-up interconnect structure 115 may comprise redistribution layers (RDLs) 116 over the second temporary carrier 110 and dielectric layers 117. The redistribution layers (RDLs) 116 and dielectric layers 117 may be interleaved in a similar manner as depicted in FIG. 2D for conductive layers 72 and dielectric layers 74. Lower base build-up interconnect structure 115 may be formed using similar materials and process as shown and described herein for bridge RDLs 70. In a particular embodiment of FIG. 4A, a build-up interconnect structure 118 may be formed on the bottom side of the bridge and as part of the bridge 100 before the bridge 100 is mounted to the temporary carrier 110 or incorporated within the interposer 200. In such instances, the bridge 100 may comprise through vias, such as vertical interconnects 27 (as also depicted in FIG. 2B) for connection to the build-up interconnect structure 118. In such embodiments, the build-up interconnect structure 118 may be disposed within mounting sites 78 and not under through mold interconnects 120, while in other embodiments the build-up interconnect structure 118 and lower base build-up interconnect structure 115 may be disposed as shown in FIG. 4A.

FIG. 4A further depicts forming through mold interconnects 120 in the periphery 122 of the mounting site 78. The periphery 122 of the mounting site 78 extends around a perimeter of the molded bridge 100. The through mold interconnects 120 can be formed as columns, pillars, posts, bumps, or studs that are formed of copper or other suitable conductive material. Through mold interconnects 120 can be formed using patterning and metal deposition processes such as printing, PVD, CVD, sputtering, electrolytic plating, electroless plating, metal evaporation, metal sputtering, or other suitable metal deposition processes. When through mold interconnects 120 are formed by plating, a seed layer can be used as part of the plating process. Through mold interconnects 120 can be one or more layers of Al, Cu, Sn, Ni, Au, Ag, Pd, solder, or other suitable electrically conductive material and can include one or more layers. The materials and processes disclosed for formation of through mold interconnects 120 may apply similarly to conductive interconnects 60. In some embodiments, the through mold interconnects 120 may comprise copper posts. In particular embodiments, the copper posts may have a height in a range of 20-100 micrometers (μm) and a cross-sectional thickness in a range of 3-20 μm. In some embodiments, through mold interconnects 120 may couple physically and electrically with one or more portions of the RDLs 116 of the lower base build-up interconnect structure 115. In additional embodiments, lower base build-up interconnect structure 115 may be disposed within mounting site 78, and RDLs 116 may not be coupled, electrically or physically, with through mold interconnects 120.

In other embodiments, through mold interconnects 120 of the molded bridge 100 may comprise 3D blocks as discussed in US Provisional Ser. No. 18/545,927, entitled "Semiconductor Assembly Comprising a 3D Block and Method of Making the Same" which was filed on Dec. 19, 2023, the entirety of which is hereby incorporated herein by reference.

Figure 4B:
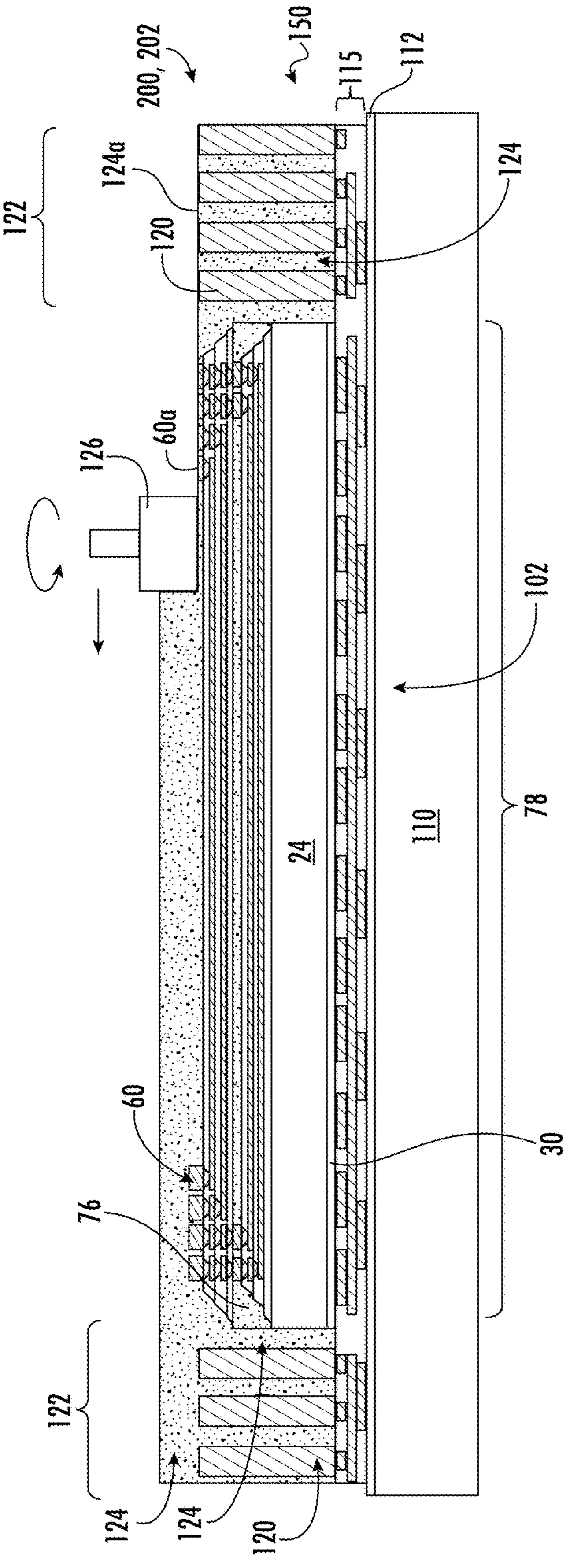

In the particular embodiment of FIG. 4B, depicted is assembly of interposer 202 as part of molded interposer base 150, in this instance comprising a known-good bridge 102. Known-good bridges 102 are used as there is an opportunity to test (electrically or optically) and potentially repair, replace, or rework traces and other electrical functionality of one or both of the component 24 and the known good bridges 102, before the known good bridges 102 are embedded in the encapsulant 124 to ensure the whole interposer 202 is functional at the end of the process.

FIG. 4B illustrates a known good fan-out bridge 102 after mounting to the mounting site 78 on the second temporary carrier 110 and over lower base build-up interconnect structure 115, and similar to FIG. 2C, disposing an encapsulant 124 over the known good molded bridge 102 and around the through mold interconnects 120 to form interposer base 150. In some embodiments, die attach film (DAF) 30 may be disposed over temporary carrier 110 to maintain a position of the bridge 100, 102 during processing. In some embodiments, interposer base 150 may comprise lower base build-up interconnect structure 115, and in further embodiments, the interposer base 150 may not comprise a build-up interconnect structure, having a planarized encapsulant surface 124*a*, on a front side and a back side of the interposer base 150. The encapsulant 124 may comprise an organic material, a mold compound, a polyimide, a composite material, such as epoxy resin with filler, such as ABF or epoxy acrylate with filler, and is a material suitable for planarizing, such as through chemical mechanical planarizing (CMP), diamond cutter planarizing, or grinding. As shown, planarizing or grinding the encapsulant 124 may be performed using grinding tool 126 to form the interposer base 150. In some embodiments, the encapsulant 124 and the bridge encapsulant 76 may comprise the same, or similar, encapsulant material. The encapsulant 124 and the bridge encapsulant 76 directly contact one another at an edge of the bridge 100.

Figure 4C:
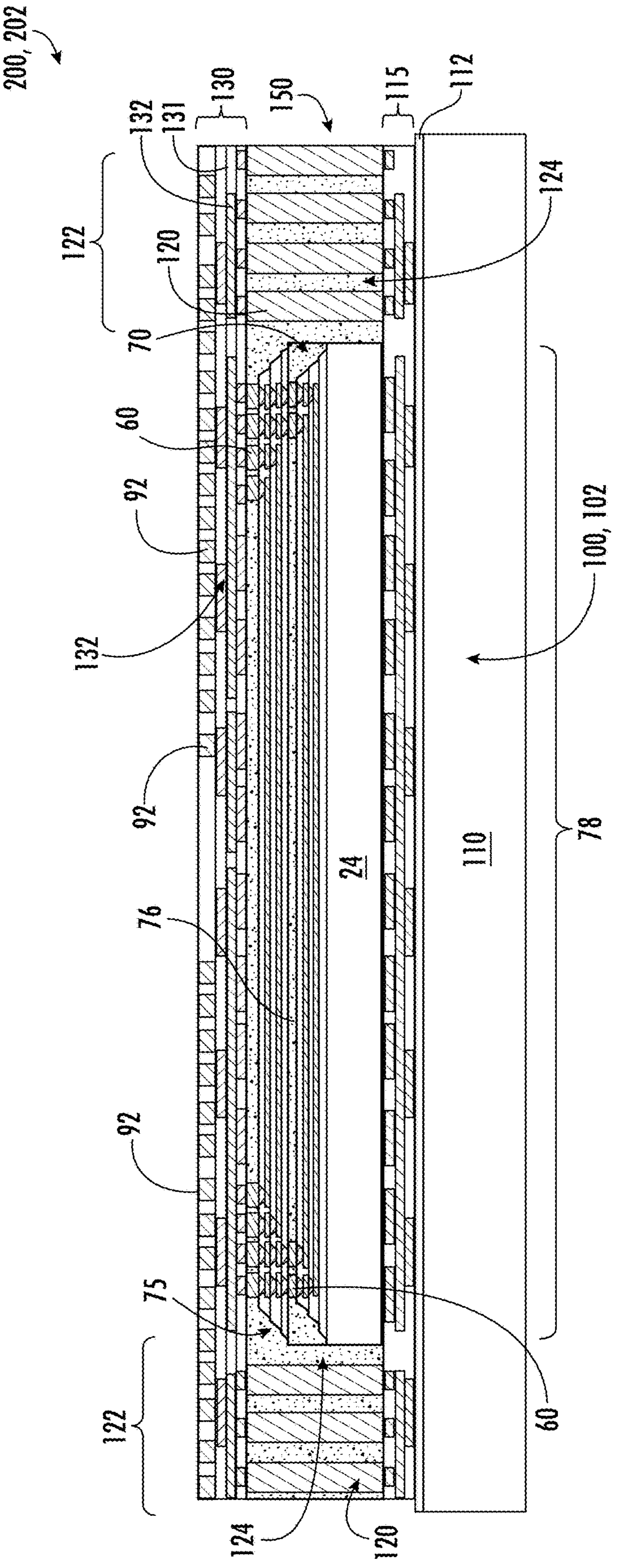

FIG. 4C illustrates forming a frontside interposer build-up 130 over the interposer base 150, including over the encapsulant 124, over the through mold interconnects 120, and over the at least one bridge 100, 102. The frontside interposer build-up 130 may comprise conductive redistribution layers (RDLs) 132 formed over the molded base 140, as well as dielectric layers 131. Conductive RDLs 132 may be formed using the same or similar materials and processes as conductive layers 72 of bridge RDL 70 and 75, and dielectric layers 131 may be formed using the same or similar materials and processes as dielectric layers 74 of bridge RDL 70 and 75. The frontside interposer build-up 130 and RDLs 132 may be formed with unit specific patterning, similar to as shown and described for conductive layers 72 of bridge RDLs 70. Frontside interposer build-up 130 may be formed using the same or similar materials and process as shown and described for bridge RDLs 70. Through mold interconnects 120 may couple physically and electrically with one or more portions of the conductive redistribution layers (RDLs) 132 of frontside interposer build-up 130 and RDLs 116 of the lower base build-up interconnect structure 115. As shown in FIG. 4C and others, conductive interconnects 60 may electrically couple two or more bridge RDLs 70, 75 together, and may also electrically couple upper bridge RDL 75 to one or more conductive RDLs 132 of frontside interposer build-up 130.

Figure 4D:
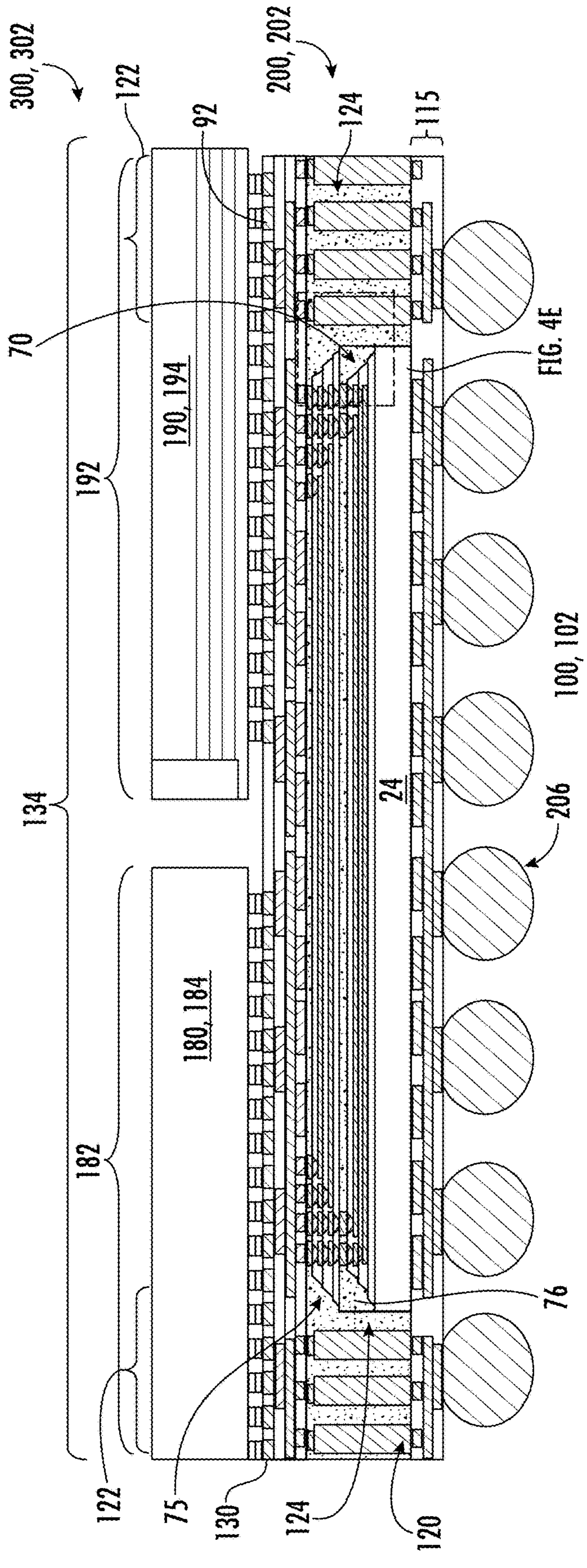

FIG. 4D illustrates disposing a first device 180 over the interposer 200, the first device 180 electrically coupled to the frontside interposer build-up 130, where a footprint 182 of the first device 180 is partially over the bridge 100 and partially over the through mold interconnects 120 disposed in periphery 122. In particular embodiments, the first device 180 may comprise any of a processor, a system on chip (SOC) device, such as a CPU and a GPU 184. FIG. 4D further depicts disposing a second device 190 over the interposer 200, the second device 190 electrically coupled to the frontside interposer build-up 130, to form electronic assembly 300, 302, where a footprint 192 of the second device 190 is partially over the bridge 100 and partially over the through mold interconnects 120 disposed in periphery 122. In particular embodiments, the second device 190 may comprise a memory device, such as a high bandwidth memory (HBM) device 194. A footprint 134 of the assembly 300, 302 is larger than, and includes all of, a footprint 182 of the first device 180, and a footprint 192 of the second device 190. According to some embodiments, frontside interposer build-up 130 may comprise alternating layers of electrically conductive traces 132, such as RDLs, and interleaved dielectric layers 131 comprising polyimide, and micro-pads (μPads) 92 coupled to the alternating layers of electrically conductive traces 132 to enable the attachment of one or more of the first device 180, the second device 190 and additional devices, such as chiplet devices, including processors and memory components.

The interposer 200, 202 as part of electronic assembly 300, 302 may comprise unit specific patterning such that a first misalignment between an edge of the molded bridge 100 and an edge of the interposer 200 is greater than a second misalignment between either an edge of the molded bridge 100 and the lower bridge RDL 70, or the lower bridge RDL 70 and the upper bridge RDL 75.

Further illustrated in FIG. 4D are package level interconnects 206 which may comprise lands, balls, pins, and external interconnects. Package level interconnects 206 may comprise solder bumps, plated copper plus solder, solder balls, and the like.

Figure 4E:
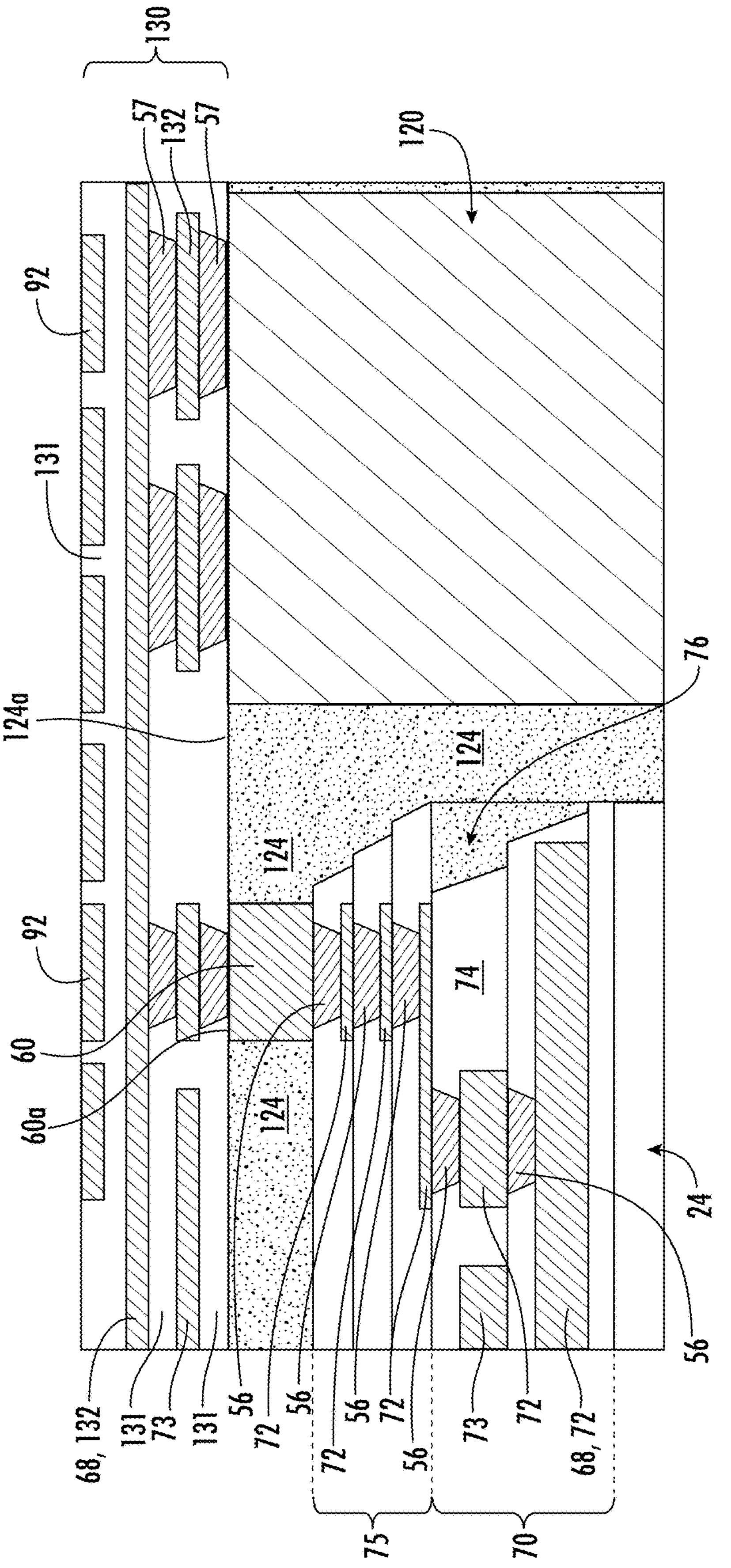
FIG. 4E illustrates a cross-sectional side view of an assembly comprising the interposer taken from the reference of FIG. 4D.

FIG. 4E illustrates an enlarged cross-sectional side view of the interposer 200 included in the assembly 300 and taken from the callout from FIG. 4D. Depicted are through mold interconnects 120 contacting encapsulant 124 and electrically coupled to a lower via 57 of frontside interposer build-up 130. The bridge RDLs 70, 75 may comprise one or more conductive layers 72, interleaved with one or more dielectric layers 74, where the conductive layers 72 may be electrically coupled to one another through one or more bridge vias 56. The bridge RDL 75 may be electrically coupled to frontside interposer build-up 130 through conductive interconnects 60, which may be electrically coupled to both lower vias 57 of frontside interposer build-up 130 and bridge vias 56. The bridge RDLs 70, may further comprise one or more Vss planes 68. Vss as used herein is taken to mean "Voltage Source Source" and refers to the negative voltage in the circuit. Vss may be a ground voltage and may be the voltage applied to a source terminal of a metal-oxide-semiconductor field-effect transistor (MOSFET). In some embodiments, conductive layers 72 may comprise redistribution layers (RDLs), formed concurrently with, and electrically isolated from, the Vss plane 68. In some embodiments, the bridge RDL 70 may further comprise one or more Vdd planes, such as Vddio planes 73. Vdd as used herein refers to a dedicated power plane that supplies a positive voltage to the circuit, and Vddio as used herein refers to a dedicated power plane that supplies positive voltage to the input/output (I/O) pins of a chip. The Vddio plane 73 voltage is distinct from, and typically a higher voltage than, a core voltage (Vcore) of the chip and maintains signal integrity, optimizing power efficiency, and enabling compatibility between components with different signaling voltages. As with the Vss plane 68, the Vdd and Vddio plane 73 may be formed concurrently with, and electrically isolated from, conductive layers 72 which may comprise redistribution layers (RDLs). Conductive interconnects 60 may be electrically coupled to an upper most conductive layer 72 through conductive via 56, and to a bottom or lower via 57 of frontside interposer build-up 130. Similar to or the same as conductive layers 72 of bridge RDL 70, the frontside interposer build-up 130 may comprise multiple conductive RDL layers 132 formed as traces, wires, power and (or) ground planes, differential pairs, vias, vertical interconnects, capture pads, electrical components, high-density interconnects, high density routing, and other, similar elements according to electrical design requirements. The frontside interposer build-up 130 may also comprise multiple dielectric layers 131, which may be similar to or the same as one or more dielectric layers 74 of bridge RDL 70. As in bridge RDL 70, the frontside interposer build-up 130 (as well as lower base build-up interconnect structure 115 and backside interposer build-up 160) may also comprise one or more Vss planes 68, Vdd and Vddio planes 73. FIG. 4E further illustrates micro-pads (μPads) 92 coupled to the alternating layers of electrically conductive traces 132 through vias 57 in frontside interposer build-up 130. In some embodiments, the micro-pads 92 may comprise pad dimensions of from 0.1 μm to 15 μm, and from 0.15 μm to 35 μm, and about 0.25 μm, at a pitch (center to center distance between pads) of from 30 μm to 60 μm. In other embodiments, bonding pads of sizes and pitches greater than those used for micro-pads may be used, such as pads with widths of 50 um at a pitch of 100 um, or even larger pad sizes on larger pitches.

In addition to providing high density connections between components, such as first device 180, second device 190, and additional components, one or more of the bridge RDLs 70 and the frontside interposer build-up 130 can also include one or more of Metal-insulator-Metal (MiM) capacitors and interdigitated trace capacitors for signal, clock, and power integrity. The MiM may be formed as part of the bridge RDLs 70 on the structural material **24*a* (Si, SiN, etc) of the bridge 100, and in particular embodiments, the MiM could be part of the frontside interposer build-up 130. In a similar fashion, bridge RDLs 70 and (or) frontside interposer build-up 130** may include inductors formed as part of the RDL.

The interposer 200, 202 as shown being formed in FIGS. 4A-4C and integrated into the assembly 300 of FIG. 4D, may be built to integrate various components, enabling high-density routing and providing signal, clock and power paths. The interposer 200, 202 can be constructed with or without a carrier. The carrier-based method allows for the manufacturing of very thin interposers, using pre-thinned bridges, ensuring precise alignment and stability. Alternatively, the carrier-free method offers a simpler and potentially more cost-effective solution for applications with fewer constraints. For a carrier-based flow, a temporary carrier 110, such as a structural carrier, typically glass and similar glass-based composites, may be used to support the build-up of through mold interconnect posts 120. The carrier

110 may be used for structural support as the interposer's thickness is limited by the aspect ratio requirements for plating through mold posts 120. For an optional backside PI layer there may be a PI Coat, Expose, Develop, and Cure to apply a polyimide layer to provide additional dielectric insulation. Through Mold Interconnects 120 may be formed with a Cu post build-up, which may use temporary carrier 110 for support. Dry Film Photoresist (DFR) lamination, exposure, development, Cu post plating, and etching form the copper posts that serve as vertical interconnects through the molded interposer. A chip or bridge attach may be accomplished by the bridges being thinned and die-attach film (DAF) 30 being applied to the backside. Bridges 100 can be electrically tested to identify good bridge dies. In some cases, defects in bridges 100 can be repaired or routed around by using an adaptive patterning process. Sawn Known-good bridges 100 are then placed within the interposer 200. The same process is used to attach other active or non-active devices. Mold and front grind may be applied. After molding, the interposer 200 is front ground to reveal the conductive interconnects 60 and through mold interconnects 120 as well as create planarized surface 124*a*, for smooth formation of subsequent layers, such as conductive layers and dielectric layers formed as part of the build up interconnects as disclosed herein.

For the Carrier-free Flow, the bridge attach may be accomplished with full-thickness bridges 100 being used to avoid the need for thinning. Die-attach film may be applied to the backside of the bridges 100, and known-good bridge dies are placed within the interposer without the use of temporary carrier 110. Prefabricated vertical interconnect blocks (VIBs) may be placed using the same methodology. The VIBs may be similar to the RDL bridge 100 except that instead of providing horizontal connections they primarily provide vertical connections. They may include some horizontal routing for differing pitch on each side of the block. Other active or non-active devices may be attached in a similar fashion. Mold and front grind may be applied as shown for the carrier-based flow, followed by front-grinding to reveal the conductive interconnects 60 and through mold interconnects 120 as well as create planarized surface 124*a*, for smooth formation of subsequent layers, such as conductive layers and dielectric layers formed as part of the build up interconnects as disclosed herein.

A frontside interposer build-up 130 may be formed such that after molding and grinding, the front side of the frontside interposer build-up 130 undergoes further processing to establish high-density interconnects, such as micro-pads (μPads) 92, for first and second device attachment, including conductive redistribution layers (RDLs) 132 being built on the front side of the frontside interposer build-up 130 for interconnect routing. Polyimide layers are applied for dielectric insulation using PI coat, expose, develop, and cure. Copper redistribution layers may be built on the front side to provide high-density connections between active dies or chiplets and the bridge die with photoresist application, Cu RDL plating, strip, and etch. Micro-pads (μPads) 92 may be formed on an outermost conductive layer of frontside interposer build-up 130 of interposer 200, 202 to enable the final attachment of chiplet devices such as processors and memory components. The micro-pads 92 may be formed on the interposer surface using a photoresist application, expose, develop, μPad plating, strip, and etch similar to that used to form the interposer backside buildup.

According to some embodiments, a backside 204 of the interposer 200, 202 may optionally be processed for full integration. Depending on the construction method, materials and thicknesses of the materials comprising the interposer, the backside buildup can follow at least one of the following three paths: a two-carrier process, a single-carrier process, and a carrier-free process.

Figure 5A:
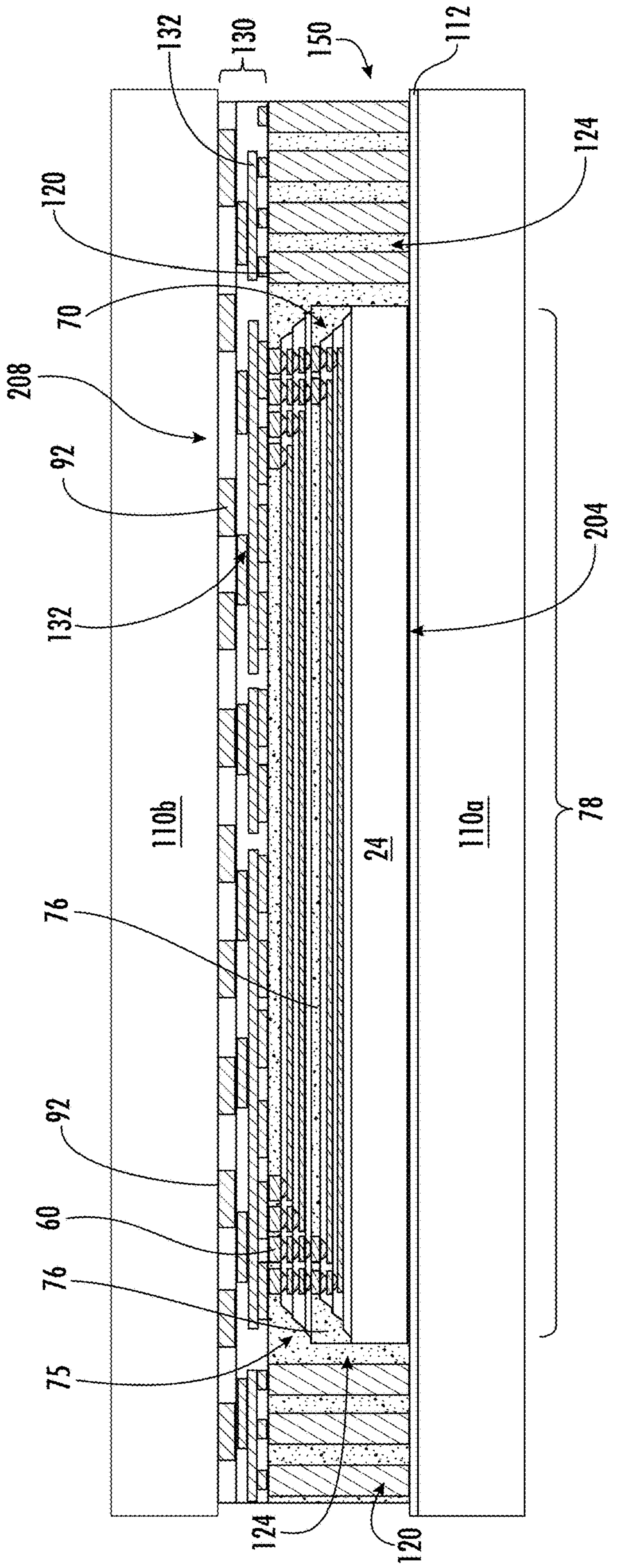
FIGS. 5A-5C depict a method of interposer formation according to a two carrier process.
Figure 5B:
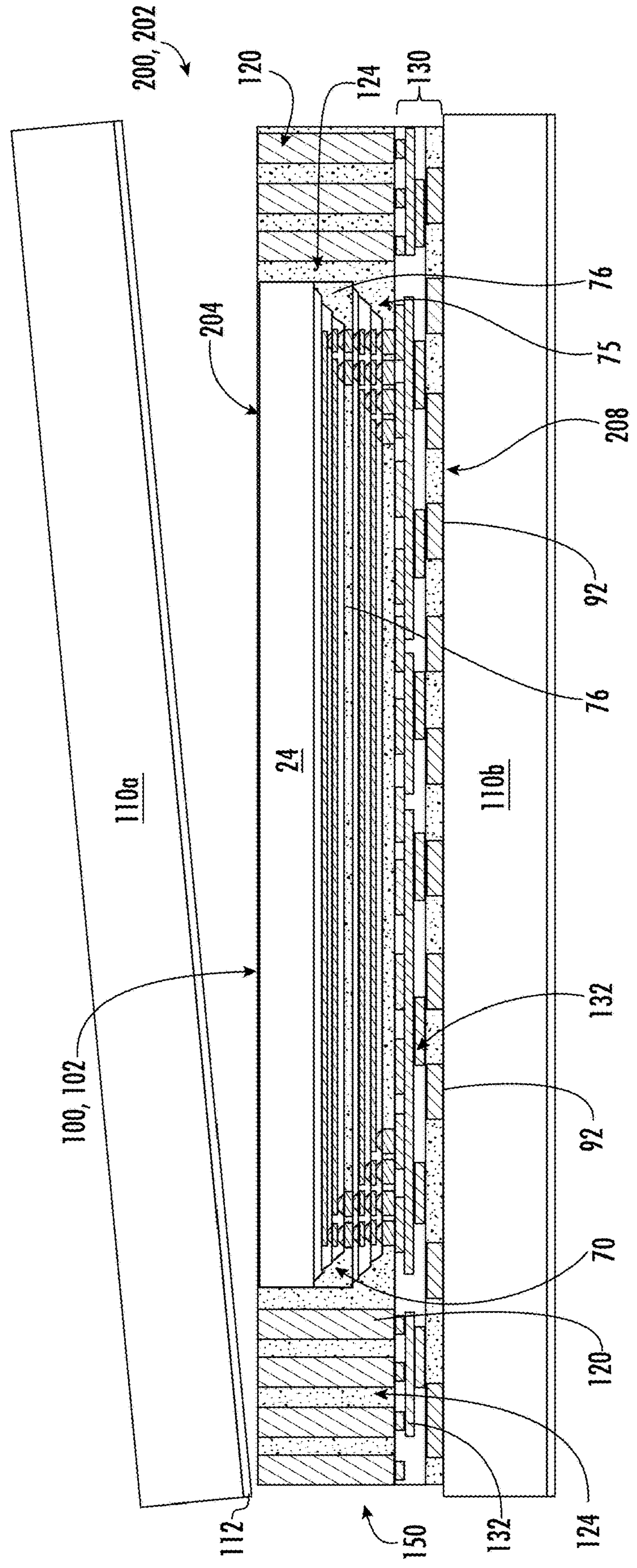
Figure 5C:
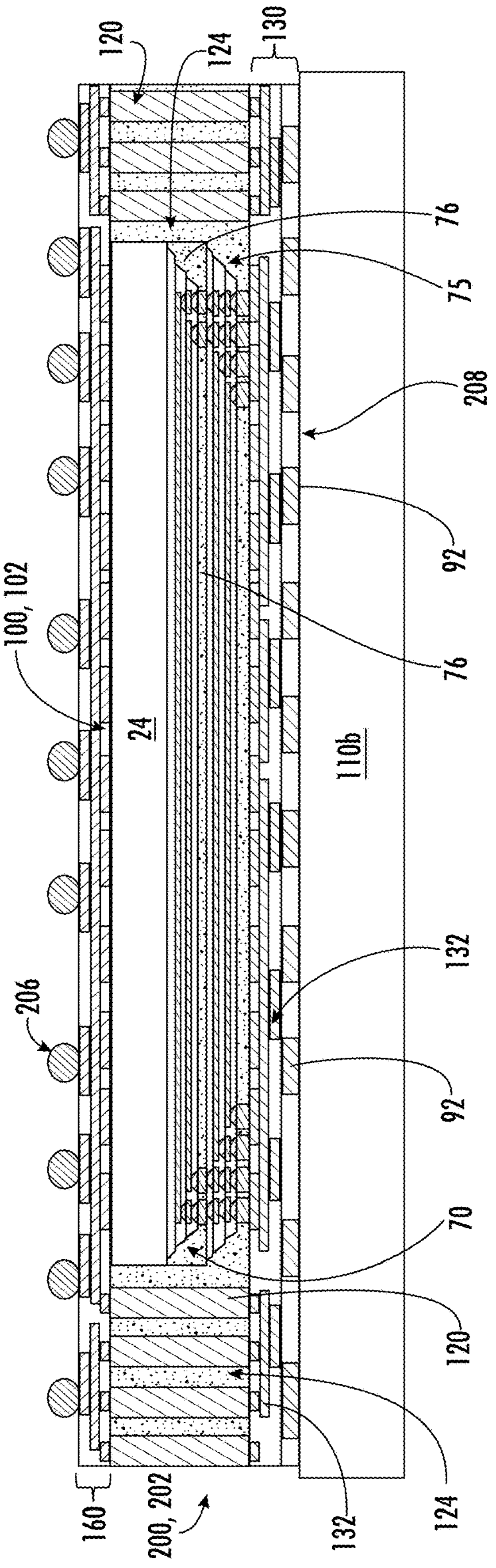

For the two-carrier process (required for the carrier-based process as seen in FIGS. 5A-5C) a first carrier 110*a* may be bonded to a backside 204 of the interposer 200, and a second carrier bonding may be accomplished with a second carrier 110*b* that is temporarily bonded using temporary bonding and debonding (TBDB) film to the front side 208 of the interposer 200 as shown in FIG. 5A. First and second carriers, 110*a* and 110*b*, respectively may comprise one or more of glass, a glass-epoxy material, a glass composite, and similar materials which are capable of maintaining structural integrity at elevated temperatures. As seen in FIG. 5B, first carrier 110*a* debonding may be accomplished with the interposer 200 being flipped, and the first carrier 110*a* being removed from the backside 204. FIG. 5C illustrates where a backside interposer build-up 160, which may be the same as, or similar to lower base build-up interconnect structure 115, comprising backside RDLs 162, dielectric layers 161, and in some embodiments, conductive interconnects, such as Cu posts, may be formed over the backside 204. Optional backside redistribution layers, Cu pillar bumps and alternative bumps, such as ball grid array and/or solder bumps may also be built on the backside 204 as part of the backside interposer build-up 160, to complete the backside interposer build-up 160 formation, followed by removal of carrier 110*b*. As shown, backside interposer build-up 160 may be electrically coupled to through mold interconnects 120 through backside RDLs 162, as well as conductive features formed as part of conductive RDLs 162, such as power and (or) ground planes.

After removal of carrier 110*b*, the interposer 200 may be subjected to a cleaning process and the molded interposer 200 is mounted to a bump encapsulation tape and cleaned to remove TBDB residue. Thereafter, the interposer 200 is singulated through precision dicing, separating the individual units for integration into higher-level systems.

For embodiments of a single carrier process, (similar to the carrier-less process when the interposer 200 needs to be very thin), carrier bonding may be used for a second carrier 110*b*, that is bonded using TBDB film to the front side 208 of the interposer 200, as seen in FIG. 5B after removal of first carrier 110*a*. The interposer 200 may be ground to the desired thickness. Copper posts and redistribution layers are built on the backside 204 for final interconnect formation, similar to as shown and described for FIG. 5C.

A carrier-free method is disclosed herein and is intended to have the specific meaning of a carrier-free method or flow, whereby the interposer is built at full thickness without using a primary or secondary carrier. According to the carrier-free method, carriers are not required after the first molding process. As such, no carriers are needed for the RDL buildup processes. Planarization as disclosed as part of the carrier-free method is not intended to significantly reduce overall interposer thickness, but rather to reduce roughness and provide a smooth surface for formation of subsequent RDL layers. For a carrier-free method (e.g., for a thick core that does not require thinning, a full thickness build may be employed, in which the interposer 200 is built at full thickness without using a primary or secondary carrier or performing any thinning. Redistribution layers and copper posts are built on the backside 204, as in the other methods. The interposer 200 in its final form may prepared for singulation by mounting the interposer 200 on dicing tape to facilitate singulation, and then singulating the interposer 200 with precision dicing, separating the individual units for integration into higher-level systems. The carrier-free method disclosed herein may be similar to, or the same as shown and described in FIGS. 9A-9S and paragraphs [0028]-[0044] of U.S. Provisional Patent Application No. 63/752,542, the entire disclosure for the provisional application of which is hereby incorporated herein by this reference, with the exception that vertical interconnect blocks (VIBs) are replaced herein by through mold interconnects 120.

The above process can offer significant technical advantages in the context of heterogeneous integration. By utilizing RDL-based bridges 100 with fine pitch interconnect, signal path lengths between active dies are minimized, which increases performance for high-performance applications such as high-performance computing (HPC), artificial intelligence (AI), and 5G systems, where high-speed data transmission and low-latency interconnects are desirable. Reducing the signal path length also means the power required to drive signals from one die or chiplet to another can be reduced. Additional benefits further include improved yield. Improved yield can be achieved due to the fine-line and fine-space nature of interconnect routing; yield loss can occur due to defects. By utilizing known-good bridges, the M FIT process reduces this risk, ensuring higher reliability. Further, the use of polyimide (PI) as a dielectric in the disclosed bridges offers several advantages over traditional silicon-based bridges. PI has a lower dielectric constant and loss tangent, reducing parasitic capacitance, improving signal integrity, and lowering power consumption, especially in high-frequency applications. Additionally, building interposers at full thickness, simplifying manufacturing while maintaining mechanical stability, reducing warpage, and improving thermal management, means the method and structure described here are beneficial for high-density packaging and robust performance.

Figure 6C:
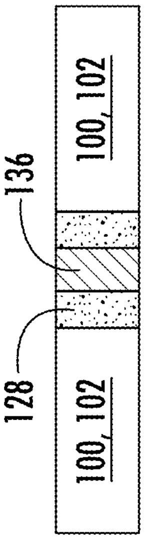
FIG. 6C illustrates a cross-sectional side-view of the structure from FIG. 6B, as taken along the section line 6C of FIG. 6B.
Figure 6B:
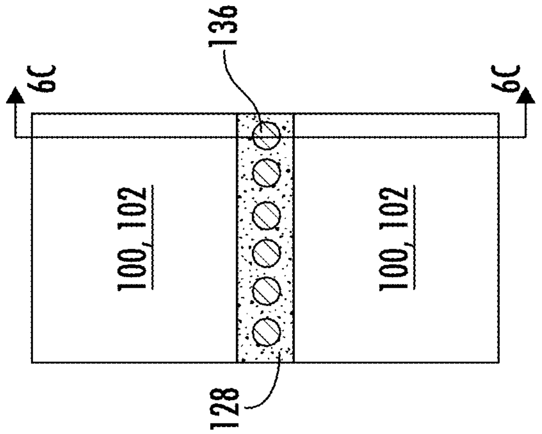
FIGS. 6A-6B show enlarged plan views of multiple bridges after singulation as taken along the section indicator of FIG. 1.
Figure 6A:
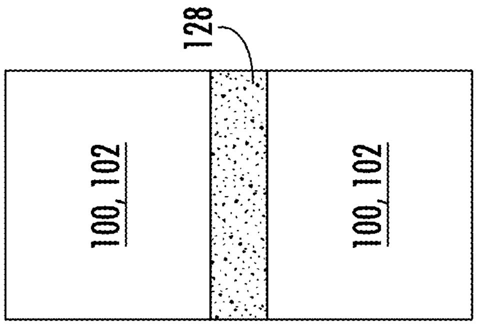

FIG. 6A provides an enlarged plan view of multiple bridges 100, and known good bridges 102, after singulation together into more than one bridge 100, rather than individually, as taken along the section indicator in FIG. 1. Encapsulant 128 is depicted disposed between and contacting the bridges 100.

FIG. 6B provides an enlarged plan view similar to the view of FIG. 6A, of multiple bridges 100, and known good bridges 102, but further includes conductive vias 136, such as vertical electrical interconnects and similar structures, surrounded by the encapsulant 128.

FIG. 6C provides a cross-sectional side-view of the bridges 100, 102 from FIG. 6B, as taken along the section line 6C.

Figure 6D:
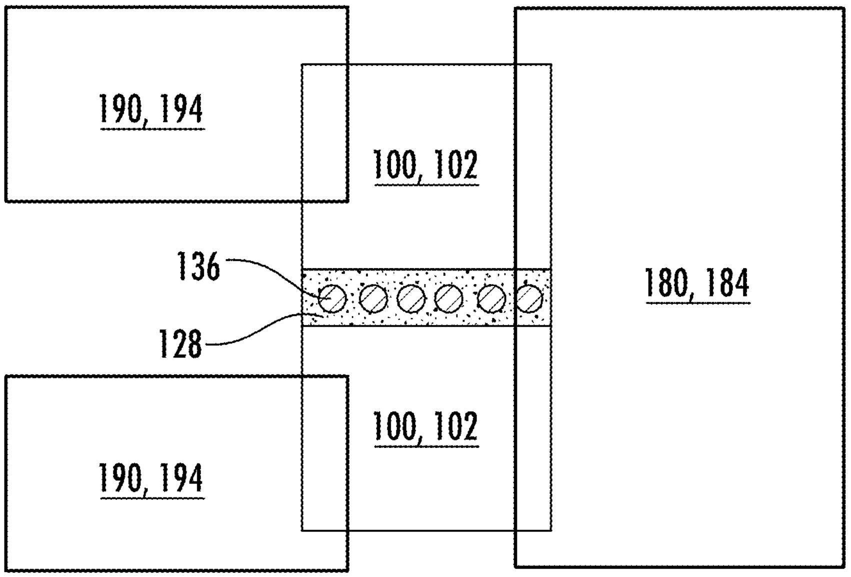
FIG. 6D depicts a plan view of the bridges from FIG. 6B coupled to a first device and a second device.

FIG. 6D provides a plan view of the bridges 100, 102 from FIG. 6B coupled to first device 180 and second device 190. In particular embodiments, the first device 180 may comprise a processor or a system on chip (SOC) device 184, according to the disclosure presented herein. In additional particular embodiments, the second device 190 may comprise multiple chiplets, such as a memory device and a high bandwidth memory (HBM) device 194 according to the disclosure presented herein. Use of the bridges 100, and known good bridges 102, allows for a reduction in a footprint 134 of the assembly 300, 302 as compared to assemblies that do not comprise the bridges 100, 102 as disclosed herein. Use of the bridges 100, 102 joined together into a multi-bridge component also allows for more efficient assembly of the bridges 100, 102 to additional devices as depicted.

Figure 7:
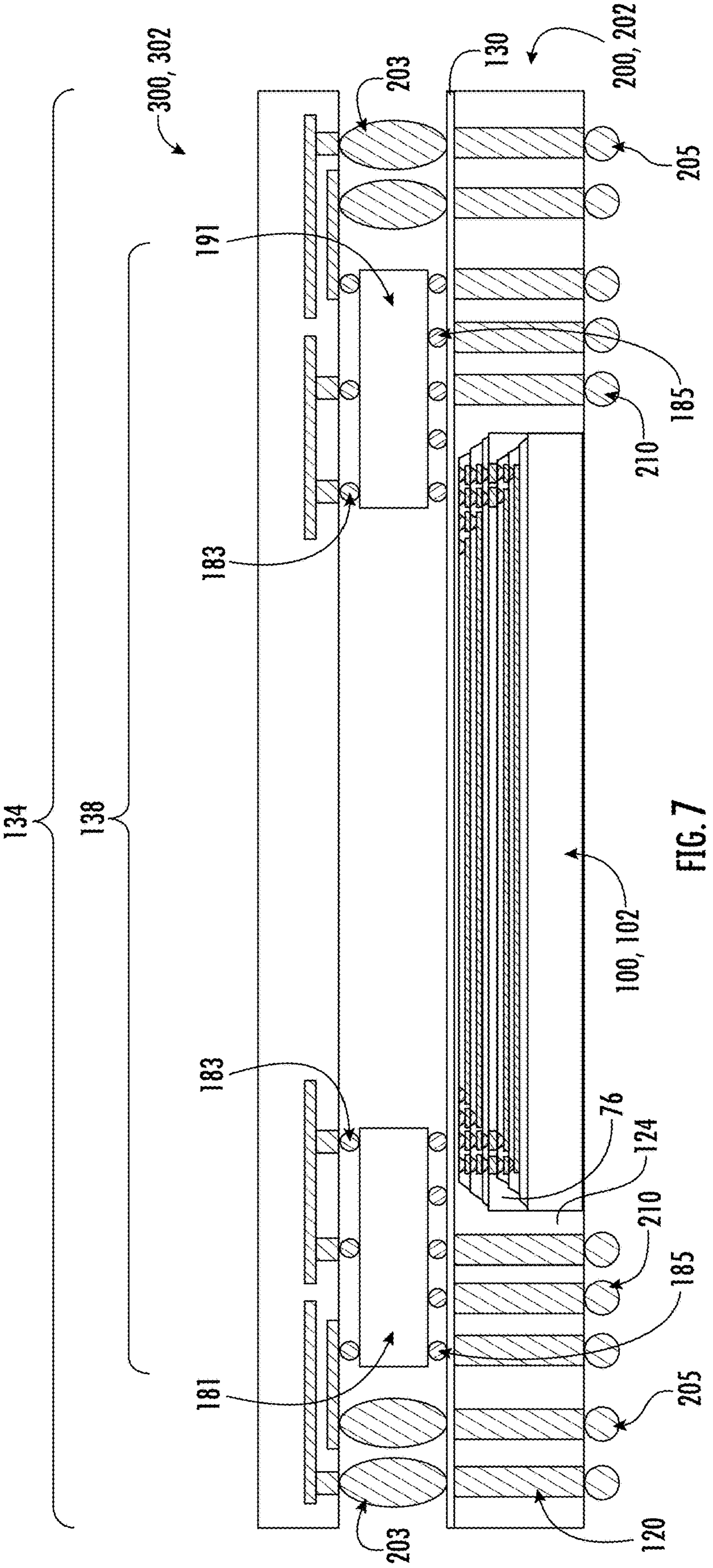
FIG. 7 represents an instance of an assembly comprising an Interposer on Interposer (IoI) with an embedded bridge, that can accommodate chips with backside power distribution networks (BSPDN).

In the embodiment of FIG. 7, illustrated is an instance of an assembly 300, 302 comprising an Interposer on Interposer (IoI) that can accommodate chips 181, 191 having backside power distribution networks (BSPDNs). The assembly 300, 302 comprises the disclosed interposer 200, 202 having an embedded bridge 100, 102. Much of the detail provided above with reference to the process, materials, and interposer 200, 202, electrical coupling of the interposer 200, 202 to frontside interposer build-up 130, and attachment of first and second devices 180, 190, respectively (using μPads 92) to frontside interposer build-up 130, of FIGS. 4C and 4D also supports FIG. 7. In the particular embodiment of FIG. 7, one or more of a first device 181 and a second device 191 may comprise a BSPDN (not shown) over a backside of the devices 181, 191, with power and ground routed through backside interconnects 183, through a top interposer, through vertical interconnects 203 electrically coupled to interposer 200, 202, and to power/ground package level interconnects 205 on a bottom surface of interposer 200, 202 for connection to a printed circuit board or other external devices. Signals may be routed from a frontside of the devices 181, 191 through frontside interconnects 185, extending through the through mold interconnects 120 of interposer 200, 202, and to signal package level interconnects 210 on a bottom surface of interposer 200, 202 for external interconnection. As in FIG. 4D, devices 181, 191 may comprise a processor or a system on chip (SOC) device 184, multiple chiplets, such as a memory device and a high bandwidth memory (HBM) device 194, comprising BSPDNs. Use of the disclosed interposer 200, 202, provides an assembly 300, 302 where all signal package level interconnects 208 are disposed within a combined footprint 138 comprising the bridge 100, first device 180 and second device 190, which is smaller than footprint 134 of the assembly 300, 302. The assembly 300, 302 of FIG. 7, utilizing bridge 100 disposed between first device 181 and second device 191 as part of the interposer 200, 202, minimizes signal path lengths between active devices, and enables the transmission of high-speed signals across bridge 100, 102, between first device 181 and second device 191, where the devices comprise BSPDNs. Minimizing signal path lengths between devices increases performance for high-performance computing (HPC), artificial intelligence (AI), and 5G systems, where high-speed data transmission and low-latency interconnects are desirable, as well as reducing power demand for signal transmission.

Figure 8:
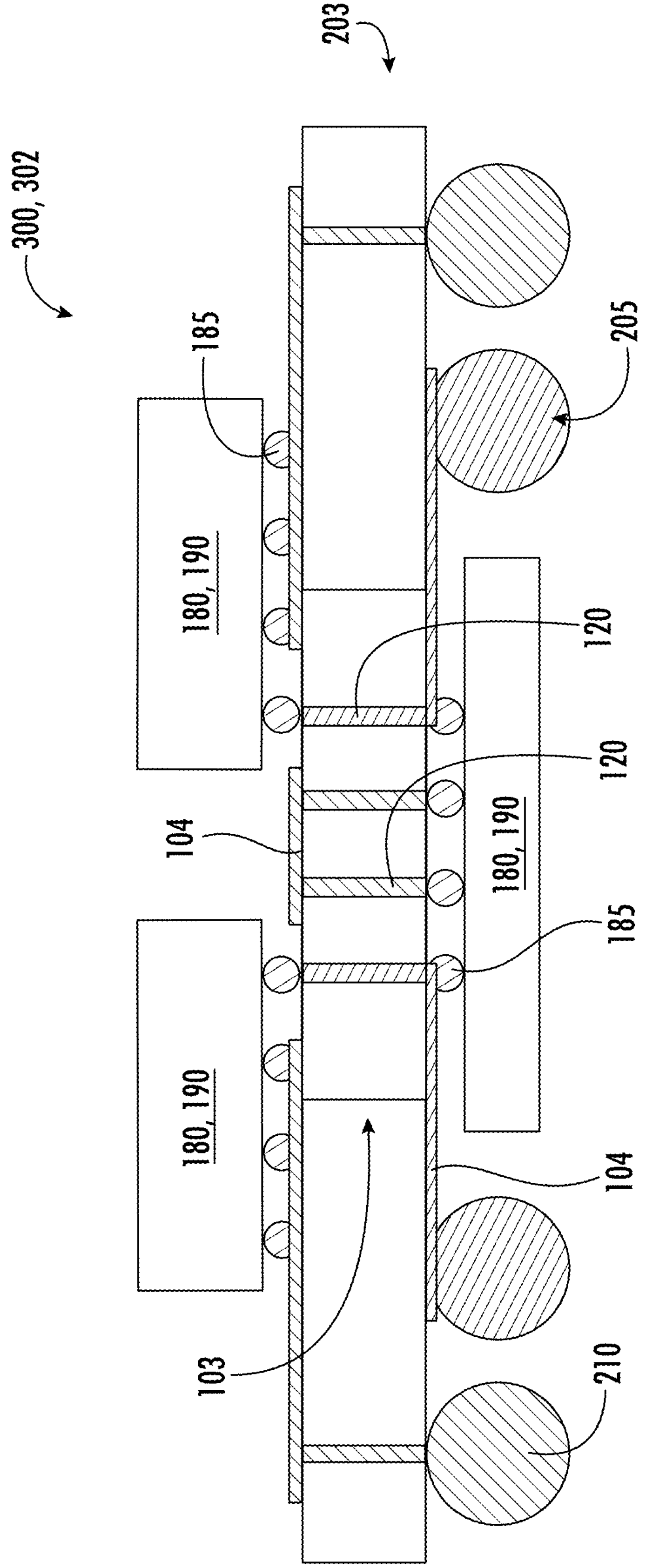
FIG. 8 shows an assembly in which the interposer comprises a bridge having double-sided traces and through vias.

FIG. 8 illustrates an instance of an assembly 300, 302 in which the interposer 203 comprises a double sided bridge 103 that comprises traces 104, disposed on both sides of bridge 103, where the traces may be the same as, or similar to, conductive layers 72 of bridge RDLs 70, and through vias that may be the same as, or similar to, through mold vias 120, that may have been formed when the bridge 100 was being fabricated and before it was incorporated within the interposer 200. In some embodiments of the assembly 300, 302 of FIG. 8, signal interconnects 210 may be disposed around a perimeter of the assembly 300, 302, with power/ground interconnects 205 located within the perimeter of the assembly 300, 302. In additional embodiments of the assembly 300, 302 of FIG. 8, signal interconnects 210 may be disposed in an interior of the assembly 300, 302, with power/ground interconnects 205 located around a perimeter of the assembly 300, 302. First and second devices, 180, 190, respectively, may be disposed in any of the locations as depicted. Similar elements and features in FIG. 8 may be the same or similar with those elements and features shown in FIGS. 2A-2F, 4B-4E, and FIG. 7, but for brevity, may not repeat all the detail previously provided.

Accordingly, the present disclosure represents a significant innovation in advanced packaging for heterogeneous integration. By leveraging RDL technology for both the interposer and embedded bridge dies, high-density interconnects, superior electrical performance, and design flexibility is achieved. The use of polyimide as a dielectric material in the RDL-based bridge dies offers improved signal integrity and reduced power consumption, that is well-suited for high-performance applications such as HPC, AI, and 5G. The ability to build the interposer at full thickness provides additional mechanical and thermal advantages, positions the present technology as a leading solution for next-generation semiconductor packaging More specifically, this disclosure, its aspects and embodiments, are not limited to the specific material types, components, methods, or other examples disclosed herein. Many additional material types, components, methods, and procedures known in the art are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

While this disclosure includes a number of embodiments in different forms, the drawings and written descriptions present detail of particular embodiments with the understanding that the present disclosure is to be considered as an exemplification of the principles of the disclosed methods and systems and is not intended to limit the broad aspect of the disclosed concepts to the embodiments illustrated. Additionally, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

Many additional implementations are possible. Further implementations are within the CLAIMS.

What is claimed is:

1. An interposer, comprising:

a known good build-up RDL bridge comprising:

a component comprising a structural base material and one or more vertically stacked bridge redistribution layers (RDLs) disposed over the component; and a bridge encapsulant disposed between the vertically stacked bridge RDLs;

through mold interconnects disposed in a periphery of the known good build-up RDL bridge;

a backside interposer build-up electrically coupled to the through mold interconnects and the component opposite the bridge RDLs;

an encapsulant disposed around the through mold interconnects, around the known good build-up RDL bridge and over the backside interposer build-up; and a frontside interposer build-up over the encapsulant, over the through mold interconnects, and electrically coupled to the known good build-up RDL bridge.

2. The interposer of claim 1, wherein the bridge encapsulant comprises a planarized surface.

3. The interposer of claim 1, wherein the structural base material of the build-up RDL bridge comprises one or more of silicon (Si), silicon nitride (SiN), GaAs, GaN, SiC, InP, SiGe, a semiconductor, polymer, mold compound, and laminate.

4. The interposer of claim 1, wherein the bridge RDLs comprise:

alternating layers of electrically conductive traces and interleaved dielectric layers comprising polymer; and conductive interconnects coupled to the component that extend through the encapsulant.

5. The interposer of claim 4, wherein the bridge encapsulant is disposed between upper and lower layers of dielectric, wherein the bridge encapsulant is the same as the encapsulant.

6. The interposer of claim 4, wherein the bridge encapsulant is disposed between an upper layer of dielectric and a lower electrically conductive trace of the bridge RDLs, wherein the bridge encapsulant is the same as the encapsulant.

7. The interposer of claim 4, wherein the polymer comprises polyimide.

8. The interposer of claim 1, wherein the build-up RDL bridge further comprises one or more passive devices, capacitors, MIM capacitors, inductors, integrated passive devices (IPDs), Si-based IPDs, deep trench capacitors (DTCs), a chip, an integrated circuit, an active device, a buffer, a retimer, a filter, and a voltage regulator.

9. The interposer of claim 1, wherein the frontside interposer build-up comprises:

alternating layers of electrically conductive traces and interleaved dielectric layers comprising polymer; and micro-pads (μPads) coupled to the alternating layers of electrically conductive traces to enable attachment of one or more of a chip and chiplet devices, including processors and memory components.

10. The interposer of claim 1, wherein the encapsulant directly contacts the bridge encapsulant at an edge of the build-up RDL bridge.

11. An interposer, comprising a bridge comprising:

a component comprising a base material and one or more vertically stacked bridge redistribution layers (RDLs) disposed over the component, wherein the bridge RDLs comprise alternating layers of electrically conductive traces and interleaved dielectric layers comprising polymer;

a bridge encapsulant disposed between the one or more vertically stacked bridge RDLs;

through mold interconnects disposed in a periphery of the bridge;

an encapsulant disposed around the through mold interconnects and around the bridge component, wherein the encapsulant directly contacts the bridge encapsulant at an edge of the bridge; and a frontside interposer build-up over the encapsulant, over the through mold interconnects, and over the bridge.

12. The interposer of claim 11, wherein the bridge RDLs further comprise conductive interconnects electrically coupled to the electrically conductive traces that extend through the encapsulant.

13. The interposer of claim 11, wherein the bridge encapsulant is disposed between an upper layer of dielectric and a lower electrically conductive trace of adjacent bridge RDLs.

14. The interposer of claim 11, wherein the bridge encapsulant is disposed between an upper layer of dielectric and a lower layer of dielectric of adjacent bridge RDLs.

15. The interposer of claim 11, wherein the bridge comprises a known good bridge.

16. The interposer of claim 11, further comprising a backside interposer build-up contacting the component opposite the bridge RDLs and contacting the through mold interconnects.

17. The interposer of claim 11, wherein one or more of the bridge encapsulant and the encapsulant comprises a planarized surface.

18. The interposer of claim 11, wherein the bridge further comprises one or more passive devices, capacitors, MIM capacitors, inductors, integrated passive devices (IPDs), Si-based IPDs, deep trench capacitors (DTCs), a chip, an integrated circuit, an active device, a buffer, a retimer, a filter, and a voltage regulator.

19. A method of forming an interposer, comprising:
- forming a plurality of build-up RDL bridges, comprising:
  - forming one or more bridge redistribution layers (RDLs) over a base material, wherein the bridge RDLs comprise vertically stacked layers of build-up RDLs disposed over the base material;
  - disposing a bridge encapsulant between the vertically stacked layers of build-up RDLs;
  - singulating the base material to provide the plurality of build-up RDL bridges;
  - forming a plurality of through mold interconnects disposed in a periphery of bridge mounting sites disposed on a carrier;
  - mounting at least one build-up RDL bridge on one or more of the bridge mounting sites;
  - disposing encapsulant over and around the plurality of through mold interconnects and the at least one build-up RDL bridge, and
  - forming a frontside interposer build-up over the encapsulant, over the through mold interconnects, and over the at least one build-up RDL bridge.

20. The method of forming an interposer of claim 19, further comprising:
- forming the one or more bridge RDLs comprising alternating layers of electrically conductive traces and interleaved dielectric layers comprising polymer; and
- forming conductive interconnects electrically coupled to the electrically conductive traces.

21. The method of forming an interposer of claim 20, wherein the interleaved dielectric layers further comprise a bridge encapsulant disposed between upper and lower layers of polymer, wherein the bridge encapsulant is the same as the encapsulant disposed around the through mold interconnects.

22. The method of forming an interposer of claim 21, wherein the bridge encapsulant comprises a planarized surface.

23. The method of claim 20, wherein the polymer comprises polyimide.

24. The method of forming an interposer of claim 19, wherein forming the frontside interposer build-up further comprises:
- forming alternating layers of electrically conductive traces and interleaved dielectric layers comprising polymer; and
- forming micro-pads (μPads) coupled to the alternating layers of electrically conductive traces to enable attachment of one or more of chips and chiplet devices, including processors and memory components.

25. The method of forming an interposer of claim 19, wherein the method further comprises:
- testing the plurality of build-up RDL bridges to identify known good build-up RDL bridges; mounting at least one known good build-up RDL bridge on one or more of the bridge mounting sites; and
- disposing encapsulant over and around the plurality of through mold interconnects and the at least one known good build-up RDL bridge, and forming a frontside interposer build-up over the encapsulant, over the through mold interconnects, and over the at least one known good build-up RDL bridge.

26. The method of forming an interposer of claim 19, further comprising disposing one or more passive devices, capacitors, MIM capacitors, inductors, integrated passive devices (IPDs), Si-based IPDs, deep trench capacitors (DTCs), a chip, an integrated circuit, an active device, a buffer, a retimer, a filter, and a voltage regulator in the build-up RDL bridges.

27. The method of forming an interposer of claim 19, wherein the interposer is formed using unit specific patterning.

* * * * *